United States Patent
Yang

(10) Patent No.: US 10,180,477 B2
(45) Date of Patent: Jan. 15, 2019

(54) TWO-DIMENSIONAL J-RESOLVED LASER AND SEMI-LASER SPECTROSCOPY

(71) Applicant: The Board of Trustees of the University of Illinois, Urbana, IL (US)

(72) Inventor: Shaolin Yang, Chicago, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 654 days.

(21) Appl. No.: 14/765,244

(22) PCT Filed: Jan. 31, 2014

(86) PCT No.: PCT/US2014/014136
§ 371 (c)(1),
(2) Date: Jul. 31, 2015

(87) PCT Pub. No.: WO2014/121065
PCT Pub. Date: Aug. 7, 2014

(65) Prior Publication Data
US 2015/0369892 A1 Dec. 24, 2015

Related U.S. Application Data

(60) Provisional application No. 61/758,999, filed on Jan. 31, 2013.

(51) Int. Cl.
*G01R 33/483* (2006.01)
(52) U.S. Cl.
CPC .................. *G01R 33/4833* (2013.01)
(58) Field of Classification Search
CPC .......................................... G01R 33/20–33/64
See application file for complete search history.

(56) References Cited

U.S. PATENT DOCUMENTS

2003/0052677 A1* 3/2003 Pines .................... G01R 33/445
324/307
2005/0024052 A1* 2/2005 Bendall .............. G01R 33/4616
324/307

(Continued)

OTHER PUBLICATIONS

Lin et al., "Two-dimensional J-resolved LASER and semi-LASER spectroscopy of human brain," Magnetic Resonance in Medicine, vol. 71, No. 3, Apr. 19, 2013, pp. 911-920.

(Continued)

*Primary Examiner* — Huy Q Phan
*Assistant Examiner* — David Frederiksen
(74) *Attorney, Agent, or Firm* — McDonnell Boehnen Hulbert & Berghoff LLP

(57) ABSTRACT

J-resolved LASER and semi-LASER sequences for localized two-dimensional magnetic resonance spectroscopy are disclosed. After a delay time $\Delta 1$ from application of an excitation RF pulse, a first pair of slice-selective adiabatic full-passage (AFP) pulses, separated by an inter-pulse interval $\Delta_2$, is applied. At the end of the sequence a final pair of slice-selective AFP pulses, separated by a time of $\Delta_2/2+\Delta_1+t_1/2$ is applied, where $t_1$ is the duration of an incremental evolution period corresponding to the indirect dimension of a 2D J-resolved spectrum. In the case of J-resolved LASER, an additional intermediate pair of slice-selective AFP pulses, separated by an inter-pulse interval $\Delta 2$, is applied prior to the final pair of AFP pulses. An echo signal is acquired at time $t_1/2$ from the application of the last AFP pulse. The method suppresses chemical shift artifacts, J-refocused artifactual peaks, and sensitivity to RF field inhomogeneity, each being caused, at least in part, by the use of a 3 T or higher main magnetic field.

23 Claims, 10 Drawing Sheets

(56) References Cited

U.S. PATENT DOCUMENTS

| | | | | |
|---|---|---|---|---|
| 2006/0244447 A1* | 11/2006 | Michaeli | ............... | G01R 33/446 324/309 |
| 2012/0076379 A1* | 3/2012 | Dempsey | ............. | G01R 33/565 382/131 |
| 2012/0146639 A1* | 6/2012 | Sorensen | ........... | G01R 33/4633 324/309 |
| 2012/0197104 A1* | 8/2012 | Posse | ................. | G01R 33/4833 600/410 |

OTHER PUBLICATIONS

Kinchesh et al., "Spin-echo MRS in humans at high field: LASER localisation using FOCI pulses," Journal of Magnetic Resonance, vol. 175, No. 1, Jul. 1, 2005, pp. 30-43.

Lange et al., "Detection of J-Coupled Metabolites in Magnetic Resonance Spectroscopy," Dissertation ETH No. 17140, Jan. 1, 2007.

Andronesi et al., "Spectroscopic imaging with improved gradient modulated constant adiabaticity pulses on high-field clinical scanners," Journal of Magnetic Resonance, vol. 203, No. 3, Apr. 1, 2010, pp. 283-293.

Boer et al., "7-T 1H MRS with adiabatic refocusing at short TE using radiofrequency focusing with a dual-channel volume transmit coil," NMR in Biomedicine, vol. 24, No. 9, Feb. 4, 2011, pp. 1038-1046.

Scheenen et al., "Short echo time1H-MRSI of the human brain at 3T with minimal chemical shift displacement errors using adiabatic refocusing pulses," Magnetic Resonance in Medicine, vol. 59, No. 1, Oct. 29, 2007, pp. 1-6.

Schulte et al., "Improved two-dimensional J-resolved spectroscopy," NMR in Biomedicine, vol. 19, No. 2, Jan. 1, 2006, pp. 264-270.

Ryner et al., "3D Localized 2D NMR Spectroscopy on an MRI Scanner," Journal of Magnetic Resonance, Series B, vol. 107, No. 2, May 1, 1995, pp. 126-137.

Garwood et al., "Advances in Magnetic Resonance the Return of the Frequency Sweep: Designing Adiabatic Pulses for Contemporary NMR," Journal of Magnetic Resonance, vol. 153, No. 2, Dec. 1, 2001, pp. 155-177.

Barker et al., "In vivo proton MR spectroscopy of the human brain," Progress in Nuclear Magnetic Resonance Spectroscopy 49 (2006) 99-128.

Bertholdo et al., "Brain Proton Magnetic Resonance Spectroscopy," Neuroimaging Clinics of North America, Aug. 2013 edition, vol. 23, Issue 3.

Edden et al., "If J doesn't evolve, it won't J-resolve: J-Press with bandwidth-limited refocusing pulses," Proc. Intl. Soc. Mag. Reson. Med. 19 (2011) 3445.

International Search Report and Written Opinion of PCT/US2014/014136 filed Jan. 31, 2014.

* cited by examiner

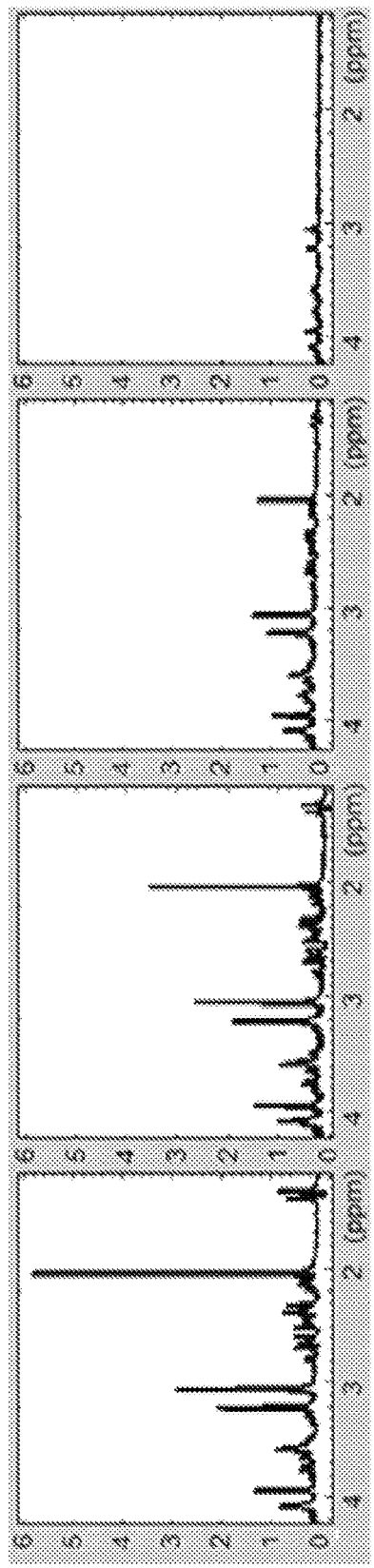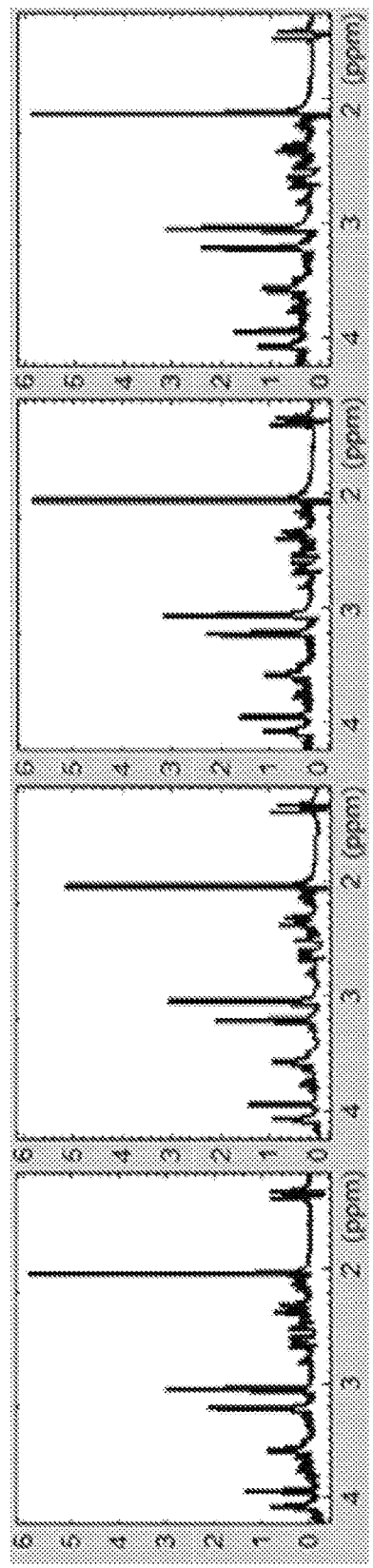

TWO-DIMENSIONAL J-RESOLVED LASER AND SEMI-LASER SPECTROSCOPY

CROSS-REFERENCE TO RELATED APPLICATIONS

This application claims the benefit of priority to U.S. Provisional Application 61/758,999 filed Jan. 31, 2013, which is hereby incorporated by reference herein.

BACKGROUND

Magnetic Resonance Spectroscopy (MRS) is an analytical method that may be used to identify and quantify certain metabolites in samples or areas of interest in the body. While relying on similar principles and using similar equipment, MRS differs from conventional Magnetic Resonance Imaging (MRI) in that the obtained spectra provide physiological and chemical information about the atoms and molecules in the sample, instead of anatomy and positional information used to form an image. By exploiting the magnetic properties of certain atomic nuclei, MRS can provide detailed information about the structure, dynamics, reaction state, and chemical environment of atoms or the molecules in which they are contained. Similar to MRI, MRS is typically performed by placing the subject or object to be imaged at or near the isocenter of a strong, uniform magnetic field, $B_0$, known as the main magnetic field. The main magnetic field causes the atomic nuclei (spins) that possess a magnetic moment in the matter comprising the subject or object to become aligned in the magnetic field. The spins form a magnetization that precesses around the magnetic field direction at a rate proportional to the magnetic field strength.

If the magnetization is perturbed by a small radio-frequency magnetic field, known as $B_1$ magnetic field, the spins may emit radio frequency (RF) radiation at a characteristic frequency. By applying the $B_1$ magnetic field as one or more timed pulses and/or sequences of pulses with delay periods in between them, the emitted RF radiation can be detected and analyzed to yield information that may be used to identify and quantify chemical compounds within an object and infer information about metabolic activity. Various techniques utilizing specific sequences of RF pulses, having specific timing, frequencies, and intensities, have been developed, providing new advances, as well as introducing new challenges.

MRS experiments may gather data in one dimension (1D MRS) or two dimensions (2D MRS). Spectra obtained in 1D-MRS relate to the chemical shift properties of the nuclei in the sample. J-resolved spectroscopy—one form of 2D MRS—may be used to analyze molecules for which the 1D-MRS spectra contain overlapping spectral peaks (multiplets) due to J-coupling. J-coupling arises from the interaction of different spin states through the chemical bonds of a molecule and may provide insight into the connectivity of atoms in a molecule. The J-resolved spectrum vertically displaces the multiplet from each nucleus by a different amount. Each peak in the 2D spectrum will have the same horizontal coordinate that it has in a non-decoupled 1D spectrum, but its vertical coordinate will be the chemical shift of the single peak that the nucleus has in a decoupled 1D spectrum.

One challenge in the field of MRS has arisen due to the use of a relatively high magnitude main magnetic field. While in conventional MRI the main magnetic field strengths range from 0.2 to 3 T, MRS may employ a main magnetic field of 1.5 T or more. Higher field strengths have the advantage of higher signal-to-noise ratio (SNR), better resolution and shorter acquisition times (1,2). However, the separation (or dispersion) of MRS spectra is magnetic field dependent and the increased chemical shift dispersion sets higher demand on the bandwidth (BW) of radiofrequency (RF) pulses that are used for the localization in MRS. Chemical shift displacement error (CSDE) is proportional to the amplitude of static field ($B_0$) and reversely proportional to the BW of slice-selective RF pulses (1,3-5).

Point-resolved spectroscopy (PRESS) is one pulse sequence commonly used in MRS. In the conventional PRESS sequence, the MR spectrum is acquired using one 90° pulse followed by two 180° pulses. The first 180° pulse is applied after a time $TE_1/2$ from the first (90°) pulse, with the second 180° pulse being applied after a time $TE_1/2+TE/2$ from the first (90°) pulse. A MR signal is acquired after a time TE. Because two slice-selective 180° refocusing pulses are used in conventional PRESS, the chemical shift artifact is especially severe (6). The limited BWs may not only cause CSDEs but may also lead to spatially dependent evolution of J-coupling, which may result in additional J-refocused artifactual peaks in two-dimensional (2D) J-resolved spectroscopy (JPRESS) (7-9). For a pair of coupled spins with a large chemical shift difference, one spin may not undergo the 1800 refocusing pulses due to the finite BW of the RF pulses in the voxel selected for its J-coupled partner. Therefore J-coupling will be refocused instead of evolving during the echo time (TE), which leads to additional so-called J-refocused peaks. The intensities of the intended J-resolved peaks may be reduced, thereby impairing spectral quantification.

RF field ($B_1$) inhomogeneity also presents issues in MRS. At high magnetic field strengths, conventional RF pulses cannot provide uniform flip angles of the magnetization in the presence of nonuniform $B_1$. Deviations from the intended flip angles may not only lead to signal attenuation and additional unwanted signals (thus compromising the reliability of the experiments), but may also increase the sidelobes of the slice profile, leading to unwanted non-zero flip angles outside the region of interest (ROI) (10). In $^1H$ MRS experiments on the brain, accurate volume selection using slice-selective RF pulses may prevent contamination of a large lipid signal from scalp or water signal from poorly shimmed regions outside the selected volume (11).

One approach that has been successful in solving or mitigating the above issues is to use adiabatic RF pulses (2,3,12-21). Adiabatic pulses offer large BWs and produce a uniform flip angle despite variation in $B_1$, provided that the $B_1$ field strength is above a certain threshold. However, in contrast to conventional RF pulses which can rotate magnetization around an axis in the rotating frame, single adiabatic pulse cannot generate plane rotation (5,18). If a pair of adiabatic refocusing pulses are used, the second adiabatic refocusing pulse can compensate or cancel the phase dispersion generated by the first adiabatic refocusing pulse. Therefore, a pair adiabatic refocusing pulses is usually applied to define a slice. A single shot spin-echo based sequence called LASER, which stands for "localization by adiabatic selective refocusing," has been used for 1D MRS (18). LASER uses a non-slice-selective excitation pulse followed by three pairs of adiabatic full-passage (AFP) pulses for signal refocusing as well as selection of three orthogonal slices in space. LASER, however, is only a 1D MRS technique and cannot provide information on J-coupling.

Recently, adiabatic pulses were employed in 1D localized MRS, spectral editing, total correlation spectroscopy, and localized chemical shift correlated spectroscopy, etc. (1,4, 22-24). However, the most commonly used localized 2D J-resolved spectroscopy, i.e., JPRESS, is still based on the PRESS sequence. As described above, PRESS suffers from several drawbacks. Namely, PRESS exhibits increased chemical shift displacement error, spatially dependent J-coupling evolution resulting in additional J-refocused peaks, and sensitivity to RF field inhomogeneity leading to signal attenuation and unwanted signals. These drawbacks can lead to reduced intensities of the desired J-resolved peaks, impair spectral quantification, increase sidelobes of the slice profile and compromise the overall reliability of spectral quantification. Thus, a need remains in the art for an improved 2D J-resolved spectroscopy technique that provides for more reliable and accurate quantification of metabolites at 3 T and higher field strengths.

Overview

Embodiments disclosed herein provide novel systems and methods implementing two-dimensional (2D) J-resolved localized and semi-localized by adiabatic selective refocusing (LASER and semi-LASER) spectroscopy techniques, named "J-resolved LASER" and "J-resolved sLASER," respectively. These sequences can provide uniform flip angle over large bandwidths, and suppress chemical shift artifacts and additional J-refocused artifactual peaks that are caused, at least in part, by the application of a 3 T or higher main magnetic field. In the J-resolved LASER sequence, three pairs of adiabatic pulses are employed for voxel localization, whereas two-pairs of adiabatic pulses are used in J-resolved sLASER. To obtain 2D J-resolved spectra—something not achieved with the known LASER sequence—the first half of the $t_1$ period is inserted between the last pair of adiabatic pulses, where $t_1$ corresponds to the incremental evolution period to implement the 2D J-resolved LASER and sLASER spectroscopy.

In the J-resolved sLASER sequence, a nonadiabatic, optimized slice-selective 90° excitation pulse is used instead of the combination of the non-slice-selective excitation 90° pulse and the first pair of AFP pulses, considering that a slice-selective 90° pulse produces a smaller CSDE than a slice-selective 180° pulse. In this way, only two pairs of AFP pulses are needed. The echo time (TE) and the specific absorption rate (SAR) are therefore reduced. Crusher gradients and phase cycling were exploited to suppress unwanted free induction decays (FIDs), stimulated echoes, and spin-echo signals. The RF power remains within the SAR limits and the CSDE is much smaller than that in conventional JPRESS.

Compared to JPRESS, J-resolved LASER and J-resolved sLASER exhibit significant suppression of chemical shift artifacts and additional J-refocused peaks from spatially dependent J-coupling evolution, and demonstrate insensitivity to the change of RF frequency offset over large bandwidth. The results of experiments on phantoms and human brains set forth herein demonstrate the feasibility and strengths of 2D adiabatic J-resolved spectroscopy at 3 T. This technique may advance the application of in vivo 2D MR spectroscopy at 3 T and higher field strengths for more reliable and accurate quantification of metabolites.

Hence, in one respect, various embodiments of the present invention provide, in a magnetic resonance imaging (MRI) scanner system, a computer-implemented method comprising: (1) applying to an object in the MRI scanner system an excitation radio frequency (RF) pulse; (2) after a delay time, $\Delta_1$, from application of the excitation RF pulse, applying to the object, a first pair of adiabatic full-passage (AFP) pulses, wherein the first pair of AFP pulses are separated by an inter-pulse time interval, $\Delta_2$; (3) applying to the object a second pair of AFP pulses, wherein the second pair of AFP pulses are separated by a time of $\Delta_2/2+\Delta_1+t_1/2$, wherein $t_1$ corresponds to the incremental evolution period; and (4) acquiring an echo signal after an echo time (TE), wherein the length of TE corresponds to the time from application of the excitation RF pulse to $t_1/2$ from application of a last AFP pulse.

In another aspect, various embodiments of the present invention provide, in a magnetic resonance imaging (MRI) scanner system, a computer-implemented method comprising: (1) applying to an object in the MRI scanner system an excitation radio frequency (RF) pulse; (2) after a delay time, $\Delta_1$, from application of the excitation RF pulse, applying to the object, a first pair of adiabatic full-passage (AFP) pulses, wherein the first pair of AFP pulses are separated by an inter-pulse time interval, $\Delta_2$; (3) applying to the object, a second pair of AFP pulses, wherein the second pair of AFP pulses are separated by the time $\Delta_2$; (4) applying to the object, a third pair of AFP pulses, wherein the third pair of AFP pulses are separated by a time of $\Delta_2/2+\Delta_1+t_1/2$, wherein $t_1$ corresponds to the incremental evolution period; and (5) acquiring an echo signal after a time $t_1/2$ from application of a last AFP pulse.

In still another respect, various embodiments of the present invention provide an MRI scanner system comprising: (1) one or more processors; (2) memory; (3) a main magnet; (4) a plurality of gradient coils positioned in the main magnet; (5) an RF transceiver system; (6) an RF coil assembly; (7) a pulse module for transmitting signals to the RF coil assembly; (8) an RF switch controlled by the pulse module; and (9) machine-readable instructions stored in the memory that, when executed by the one or more processors, cause the MRI scanner system to carry out functions including: (a) applying to an object in the MRI scanner system an excitation radio frequency (RF) pulse; (b) after a delay time. Ai, from application of the excitation RF pulse, applying to the object, a first pair of adiabatic full-passage (AFP) pulses, wherein the first pair of AFP pulses are separated by an inter-pulse time interval, $\Delta_2$; (c) applying to the object a last pair of AFP pulses, wherein the last pair of AFP pulses are separated by a time of $\Delta_2/2+\Delta_1+t_1/2$, wherein $t_1$ corresponds to the incremental evolution period; and (d) acquiring an echo signal after a time $t_1/2$ from application of a last AFP pulse.

In still another respect, various embodiments of the present invention provide a nontransitory computer-readable medium having instructions stored thereon that, upon execution by one or more processors of an MRI system, cause the MRI system to carry out functions comprising: (1) applying to an object in the MRI scanner system an excitation radio frequency (RF) pulse; (2) after a delay time, $\Delta_1$, from application of the excitation RF pulse, applying to the object, a first pair of adiabatic full-passage (AFP) pulses, wherein the first pair of AFP pulses are separated by an inter-pulse time interval, $\Delta_2$; (3) applying to the object a last pair of AFP pulses, wherein the last pair of AFP pulses are separated by a time of $\Delta_2/2+\Delta_1+t_1/2$, wherein $t_1$ corresponds to the incremental evolution period; and (4) acquiring an echo signal after a time $t_1/2$ from application of a last AFP pulse.

These as well as other aspects, advantages, and alternatives will become apparent to those of ordinary skill in the art by reading the following detailed description, with reference where appropriate to the accompanying drawings. Further, it should be understood that this summary and other descriptions and figures provided herein are intended to illustrate the invention by way of example only and, as such, that numerous variations are possible.

BRIEF DESCRIPTION OF THE DRAWINGS

FIGS. 8A-8D illustrate 1D spectra obtained from the GE MRS Braino phantom using a JPRESS pulse sequence at a minimum TE with the center frequency offset of the RF pulses set at 2 ppm, 4 ppm, 6 ppm and 8 ppm, respectively.

FIGS. 8E-8H illustrate 1D spectra obtained from the GE MRS Braino phantom using a an example J-resolved LASER pulse sequence, in accordance with the embodiment of FIG. 1A, at a minimum TE with the center frequency offset of the RF pulses set at 2 ppm, 4 ppm, 6 ppm and 8 ppm, respectively.

DETAILED DESCRIPTION

Figure 1A:
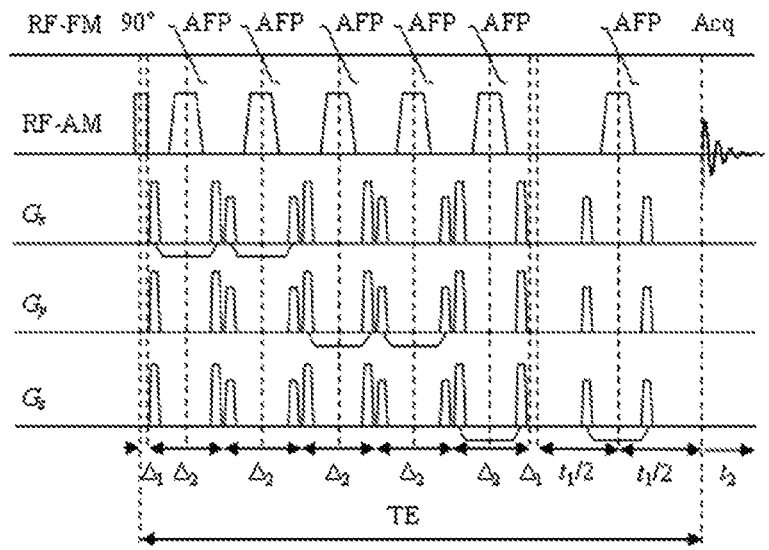
FIG. 1A illustrates an example embodiment of a J-resolved LASER pulse sequence.

The embodiments disclosed herein by way of example provide example MRS techniques applicable in an MRI system. An MRI system typically comprises hardware components including a plurality of gradient coils positioned about a bore of a magnet, an RF transceiver system, and an RF switch controlled by a pulse module to transmit RF signals to and receive RF signals from an RF coil assembly. The received RF signals are also known as magnetic resonance (MR) signal data. An MRI system also includes a computer programmed to cause the system to apply to an object in the system various RF signals, magnetic fields, and field gradients for inducing spin excitations and slice selection in an object, to acquire MR signal data from the object, to process the MR signal data, and to construct an MR image of the object from the processed MR signal data. The computer may include one or more general or special purpose processors, one or more forms of memory, and one or more hardware and/or software interfaces for interacting with and/or controlling other hardware components of the MRI system.

MRS relies, at least in part, on the principle that some atomic nuclei possess a magnetic moment (nuclear spin), which gives rise to different energy levels and resonance frequencies in a magnetic field. These MRS active nuclei absorb electromagnetic radiation at a frequency ($f$) characteristic of the isotope, as given by the Larmor equation: $f=\gamma B_0$, where the gyromagnetic ratio ($\gamma$) is a constant of each nuclear species. Different nuclei resonate at a different frequency at this field strength in proportion to their nuclear magnetic moments. For example, hydrogen nuclei (which are the common nuclei employed in MRS due to their abundance in human tissues), process at approximately 64 MHz in a magnetic field of 1.5 Tesla. Many nuclei may be used to obtain MR spectra, including hydrogen ($^1$H), phosphorus ($^{31}$P), fluorine ($^{19}$F), carbon ($^{13}$C) and sodium ($^{23}$Na).

The resonant signals of the nuclei in a sample can also depend on their different electronic environments. The electric shell interactions of these nuclei with the surrounding molecules cause a change in the local magnetic field leading to a change on the spin frequency of the atom—a phenomenon called chemical shift. The size of the chemical shift is given with respect to a reference frequency or reference sample, usually a molecule with a barely distorted electron distribution, such as tetramethylsilane. Because it is independent of the field strength, the chemical shift position of a nucleus is typically expressed in parts-per-million (ppm) (choline, for example, will be positioned at 3.22 ppm). The chemical shift provides information about the structure of the molecule and is obtained with 1D MRS. The 1D MR spectrum can be graphically represented by the x axis that corresponds to the metabolite frequency in ppm according to the chemical shift and the y axis that corresponds to the peak amplitude.

Some metabolites, such as lactate, have doublets, triplets or multiplets instead of single peaks on the chemical shift spectrum. These peaks can be explained by J-coupling, a phenomenon that occurs when the molecular structure of a metabolite is such that protons are found in different atomic groups (for example $CH_3$— and —$CH_2$—). Due to variations in local geometry (binding partners, bond lengths, angles between bonds, etc.), these groups each have a slightly different local magnetic fields and each $^1H$ therefore resonates at a frequency characteristic of its position in the molecule resulting in a multiplet peak. Where the chemical shift relates to a nucleus's environment and relative position in the molecule, the J coupling contains information about bond distance and angles and the interaction between nuclei.

In cases where the 1D MR spectrum of a molecule contains overlapping multiplets, a second dimension of data can be necessary to fully understand the chemical makeup and structure of the molecules in a sample. J-resolved spectroscopy, one form of 2D MRS, can be used to acquire J-coupling data by vertically displacing the multiplet from each nuclei by a different amount. The two dimensions of a two-dimensional MRS experiment are two frequency axes representing chemical shift and J-coupling information. Each frequency axis is associated with one of two time variables—the length of the evolution period, $t_1$, and the time elapsed during the detection period—and are each converted from a time series to a frequency series through a two-dimensional Fourier transform. Each peak in the 2D spectrum has the same horizontal coordinate that it has in a non-decoupled 1D spectrum, but its vertical coordinate is the chemical shift of the single peak that the nucleus has in a decoupled 1D spectrum. A single two-dimensional experiment is generated as a series of one-dimensional experiments, with a different specific evolution time in successive experiments, with the entire duration of the detection period recorded in each experiment.

As described above, specific pulse sequences have been developed to obtain one- and two-dimensional MRS data. The present disclosure describes modifying the basic LASER pulse sequence, which is only capable of obtaining the $1^{st}$ dimension of MRS data, to perform 2D J-resolved MRS. Further, the disclosed techniques provide several advantages over the known JPRESS pulse sequence. The feasibilities of 2D J-resolved LASER and sLASER sequences described herein were verified by both phantom and in vivo studies.

As will be fully described herein, reducing spectral overlap can be an efficient way to improve the quantification of 2D J-resolved spectra. Accordingly, two schemes are disclosed: (1) using J-resolved LASER or J-resolved sLASER instead of JPRESS to suppress the additional J-refocused artifactual peaks, thus reducing the chance for spectral overlap and at the same time maintaining the intensities of intended J-resolved peaks, and (2) using so-called "maximum-echo sampling" (i.e., starting data acquisition immediately after the second spoiler gradient of the last AFP pulse) instead of commonly used half-echo sampling (39). In half-echo sampling, J-resolved spectroscopy suffers from long dispersive tails due to the 2D phase-twist lineshape (marked by arrows in FIG. 10), which increases the chance of spectral overlap especially along the $F_1=0$ axis. Maximum-echo sampling will tilt the peak tails away from the $F_1=0$ axis so overlap can be mitigated especially from the prominent resonances of NAA, creatine (Cr), choline (Cho), residual water, and lipids. What is more, due to a large sampling interval ($\Delta t_1=10$ ms), the maximum $t_1$ is 310 ms at the last $t_1$ step. Significant signal loss due to $T_2$-weighted effects can be a drawback of 2D J-resolved spectroscopy with half-echo sampling. Therefore, using the maximum-echo sampling with the acquisition starting immediately after the final crusher gradients and a much shorter sampling interval (for example $\Delta t_1=0.8$ ms), the $T_2$-weighted effects can be minimized (32,39).

In addition, the use of AFP pulses in the LASER and sLASER sequences is shown to produce uniform flip angle over a large BW. The resonance intensities in the J-resolved LASER spectra were minimally affected by the change of RF frequency offset in a wide range. (See FIG. 8). In contrast, the resonance intensities in the JPRESS spectra were severely attenuated when the offset frequency was moved away from the frequencies of the resonance lines. The CSDEs in the form of extracranial lipid signal were reduced evidently in J-resolved LASER and sLASER spectroscopy compared to JPRESS. (See FIG. 9). The reduction of extracranial lipid signal is less obvious in J-resolved sLASER compared to JPRESS, because the regular slice-selective 90° pulse in the J-resolved sLASER sequence was set to define the slice close to the scalp. (See FIG. 10).

1. J-Resolved LASER and sLASER Principles and Example Embodiment

Figure 1B:
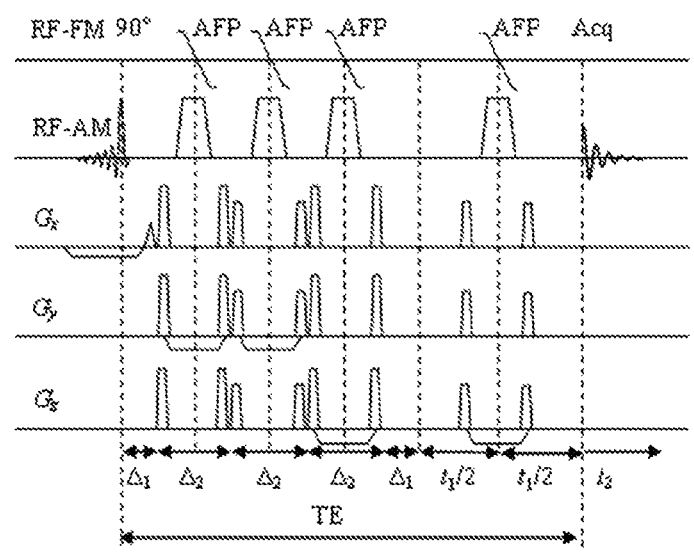
FIG. 1B illustrates an example embodiment of a J-resolved sLASER pulse sequence.

The diagrams of J-resolved LASER and J-resolved sLASER sequences are shown in FIGS. 1A and 1B, respectively. The J-resolved LASER sequence (FIG. 1A) includes a non-slice-selective 90° excitation pulse and three pairs of slice-selective 180° refocusing AFP pulses. A pair of crusher gradients is positioned symmetrically around each AFP pulse to suppress unwanted FIDs. To build the second dimension, the first half of the incremental period t (evolution time) is inserted between the last pair of AFP pulses in the 2D J-resolved LASER sequence. By inserting $t_1/2$ between the last pair of AFP pulses, the J-coupling signal is permitted to evolve, thereby building the second dimension, a result which is not possible using the traditional LASER sequence in which all of the AFP pulses are identically spaced. To rephase the inhomogeneous evolution of $\Delta_1$ (the interval between the excitation RF pulse and the beginning of the first AFP spoiler gradient), another $\Delta_1$ was also placed between the last pair of 180° AFP pulses to form an echo. A minimum number of eight averages were acquired for every incremental $t_1$. For every TE step, t is incremented by a $\Delta t_1$. In addition to the crusher gradients, 8-step phase cycling was applied for suppressing unwanted FIDs. RF-AM shows the amplitude modulation profiles of the AFP pulses, RF-FM the frequency modulation profiles. $\Delta_1$ is the interval between the excitation RF pulse and the beginning of the first AFP spoiler gradient. $\Delta_2$ is the interval between a pair of AFP spoiler gradients, including the AFP pulse. $t_1$ is the incremental evolution period. Due to the three pairs of AFP pulses employed in the J-resolved LASER sequence, the resultant long TE may increase the apparent transverse relaxation $T_2$ effect, and the RF power deposition may increase as well.

FIG. 1B depicts an example J-resolved sLASER pulse sequence. A slice-selective 90° excitation pulse, instead of a combination of a non-slice-selective 90° excitation pulse and a pair of AFP pulses in the J-resolved LASER sequence, was used for both slice selection and excitation, so the TE can be shorter while the CSDE caused by a regular slice-selective 90° pulse is much less than a 180° pulse. Again, the first half of the incremental period $t_1$ is inserted between the last pair of AFP pulses to build the second dimension.

The clinically available maximum $B_1$ of the quadrature transmit body coil of the Philips Achieva 3 T MRI system is 13.5 µT. With this $B_1$ value, the duration of an AFP pulse is 5.3 ms and its BW is 4748 Hz, whereas a conventional nonadiabatic RF pulse can only have a BW of about 2000 Hz for a 90° pulse and 1200 Hz for a 180° pulse. The water signal was suppressed by the VAPOR (variable pulse power and optimized relaxation delays) scheme except for the slice profile experiments. Along with each pair of AFP pulses, there were spoiler gradients with an amplitude of 10 mT/m and a duration of 0.31 ms (0.155 ms ramp-up/down times without top) around the first AFP pulse and with 8 mT/m and 0.31 ms (0.155 ms ramp-up/down times without top) around the second AFP pulse for phantoms experiments. In the in vivo experiments, the duration of spoiler gradients was adjusted to 1.81 ms with two ramps of 0.155 ms and a top of 1.5 ms. Other durations, amplitudes and ramp-up/down times for the gradient pulses are also contemplated herein.

Figure 2:
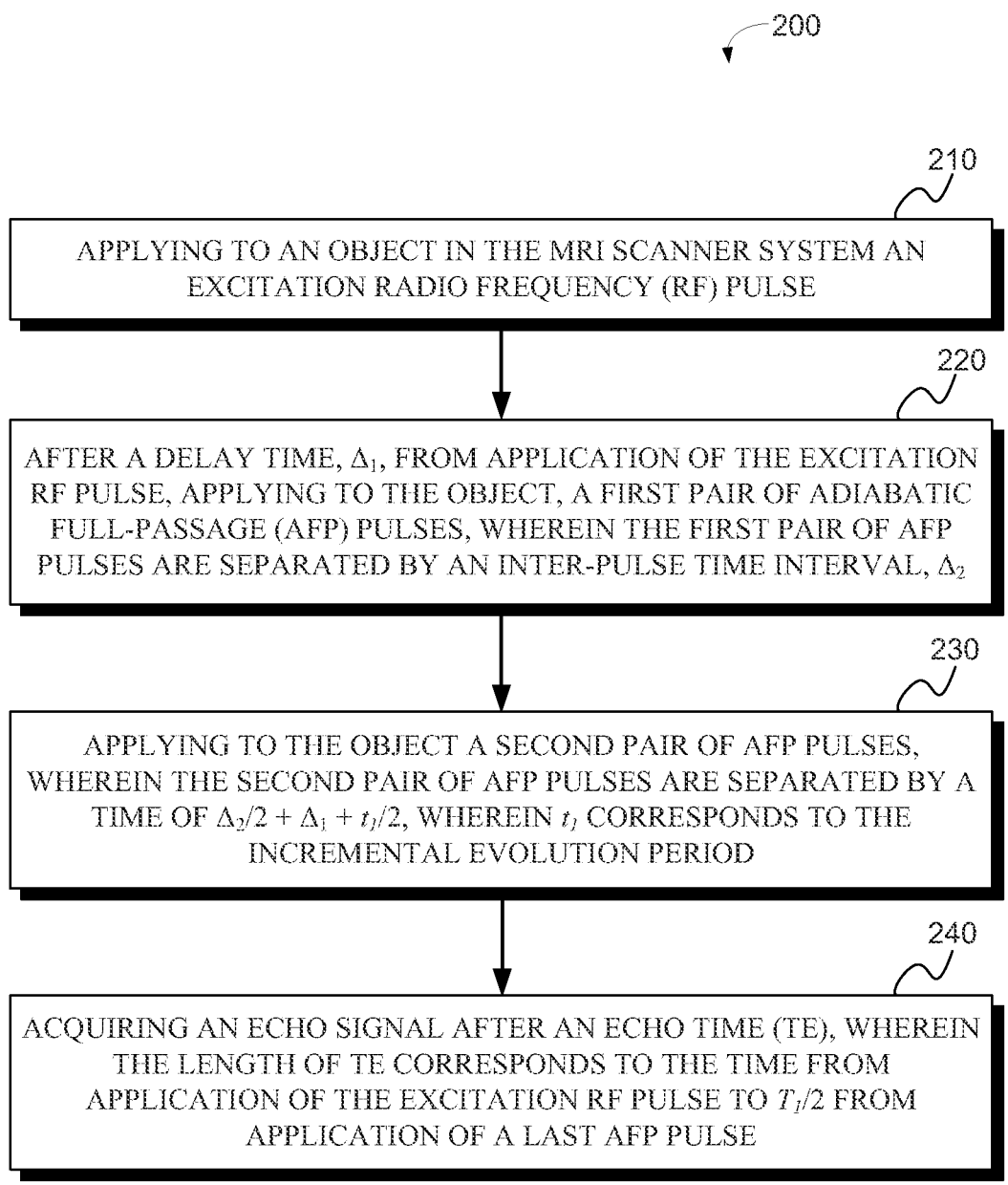
FIGS. 2 and 3 illustrate example embodiments of methods for implementing J-resolved sLASER and LASER sequences.
Figure 3:
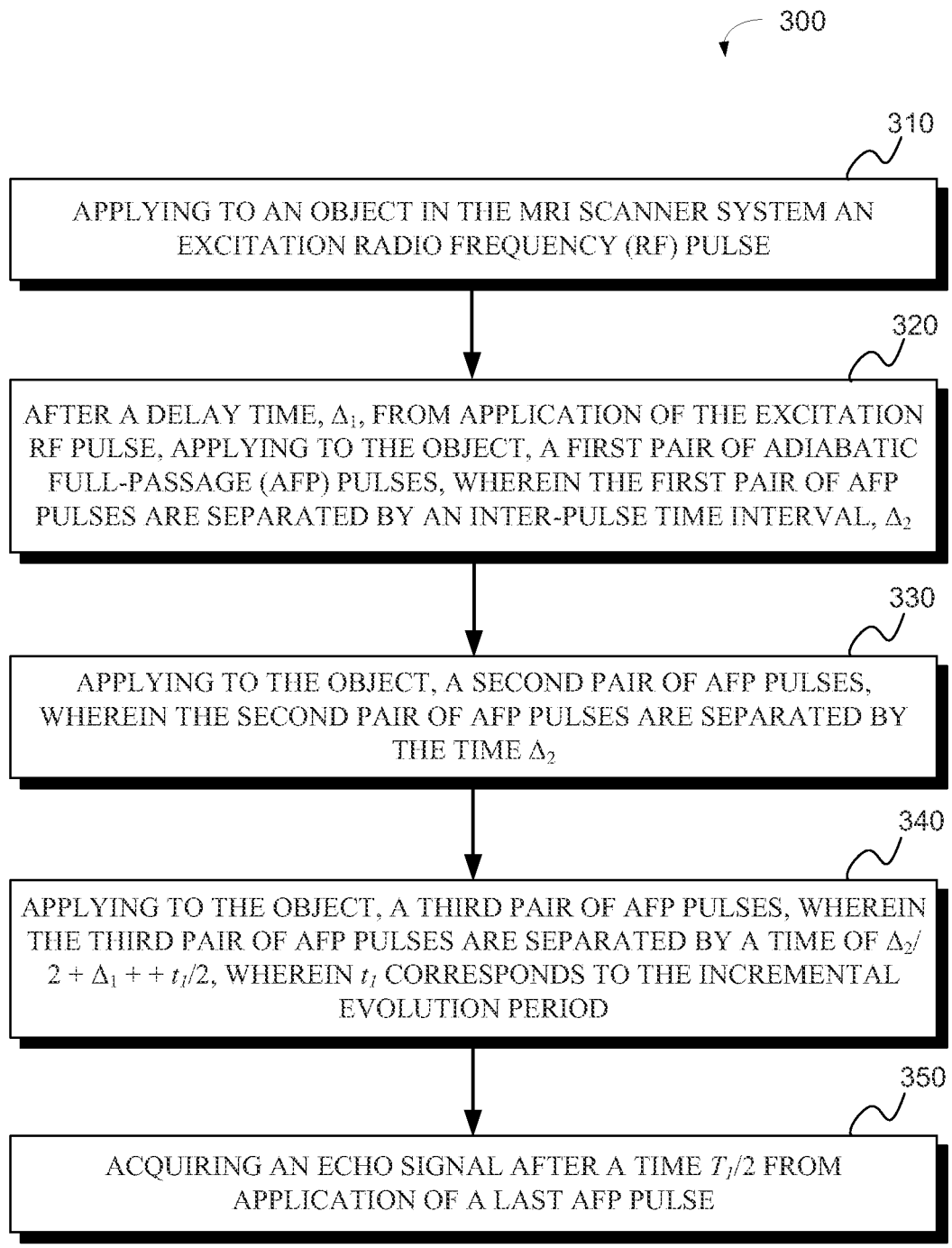

Example embodiments of J-resolved LASER and sLASER MRS methods 200, 300 are illustrated in FIGS. 2 and 3. By way of non-limiting example, the example method can be a computer-implemented method in an MRI system such as the one described above.

As illustrated in FIG. 2, at step 210, an excitation radio frequency (RF) pulse is applied to an object in the MRI scanner system. For J-resolved sLASER methods, the excitation RF pulse is a non-adiabatic slice-selective 90° RF pulse. After a delay time, $\Delta_1$, from application of the excitation RF pulse, a first pair of adiabatic full-passage (AFP) pulses are applied to the object. The first pair of AFP pulses is separated by an inter-pulse time interval, $\Delta_2$ (220). At step 230, a second pair of AFP pulses are applied to the object. The second pair of AFP pulses is separated by a time of $\Delta_2/2+\Delta_1+t_1/2$. The time interval $t_1$ corresponds to the incremental evolution period. By adding half of the incremental evolution period between the last pair of AFP pulses, the second dimension of MRS data can be obtained. An echo signal is acquired after an echo time (TE), wherein the length of TE corresponds to the time from application of the excitation RF pulse to $t_1/2$ from application of a last AFP pulse. A sequence of integer N echo signals can be obtained. For each of the N different TE periods, $t_1$ is increased by $\Delta t_1$.

For both methods, application of the pairs of AFP pulses causes suppression of one or more of chemical shift artifacts, J-refocused artifactual peaks, and sensitivity to RF field inhomogeneity, each being caused, at least in part, by the application of a main magnetic field having a magnitude of 3 T or higher. Each of the AFP pulses may be slice-selective and have a duration of 5.3 milliseconds and a bandwidth of 4748 Hz.

Further, a pair of magnetic field spoiler gradients ($G_x$) along a first direction, a pair of magnetic field spoiler gradients ($G_y$) along a second direction, and a pair of magnetic field spoiler gradients ($G_z$) along a third direction around each AFP pulse can be simultaneously applied to the object. The first of the pair of magnetic field spoiler gradients along a first direction ($G_x$), along a second direction ($G_y$), and along a third direction ($G_z$) can each be applied after an excitation delay time, $\Delta_1$, from application of the excitation RF pulse. Each pair of magnetic field spoiler gradients has a time interval of $\Delta_2$.

Example embodiments of a J-resolved LASER method 300 is illustrated in FIG. 3. At step 310, an excitation radio frequency (RF) pulse is applied to an object in the MRI scanner system. For J-resolved LASER, the excitation RF pulse can be a non-slice-selective 90° RF pulse. After a delay time, $\Delta_1$ from application of the excitation RF pulse, a first pair of adiabatic full-passage (AFP) pulses is applied to the object (320). The first pair of AFP pulses are separated by an inter-pulse time interval, $\Delta_2$. A second pair of AFP pulses, separated by the time $\Delta_2$, are applied (330). At step 340, a third pair of AFP pulses, separated by a time of $\Delta_2/2+\Delta_1+t_1/2$, are applied. The time t corresponds to the incremental evolution period. An echo signal is acquired after a time $t_1/2$ from application of a last AFP pulse (350). A sequence of integer N echo signals may be obtained. For each of the N different TE periods, $t_1$ is increased by $\Delta t_1$.

It will be appreciated that J-resolved LASER and sLASER can also be embodied as a non-transitory computer-readable medium, such as magnetic disk, CD-ROM, or the like, having non-transitory computer-readable medium having stored thereon computer-executable instructions that, if executed a processor or processors of the MRI system, cause the MRI system to perform functions of the example method as described above. It will also be appreciated that the method steps described above could be modified or rearranged, and that additional steps could be added, without changing the scope or spirit of the example embodiment or other J-resolved LASER and sLASER embodiments.

2. Example Operation and Results

In accordance with example embodiments herein, systems and methods implementing J-resolved LASER and sLASER sequences were tested with phantom and human experiments.

a. Phantoms. Subjects and Instrumental Setup The experiments described herein were performed on a Philips Achieva 3 T whole body scanner (Philips Medical Systems, Best Netherlands), operating at a proton resonance frequency $f_0$=127.74 MHz. The body coil was used for transmission and a SENSE-Head-8 coil for reception. The maximum RF peak power was 13.5 µT.

A phantom containing 50 mM NAA in the buffer (pH 7.2)—the "NAA phantom—was made in house to examine the additional J-refocused peaks. The GE MRS Braino phantom (General Electric Medical Systems, Milwaukee, Wis.) was used to verify and compare the J-resolved LASER and J-resolved sLASER sequences with conventional JPRESS sequences. It contained the following brain metabolites and chemicals: (1) 12.5 mM NAA, (2) 10 mM Cr, (3) 3 mM Cho, (4) 7.5 mM myo-inositol (ml), (5) 12.5 mM glutamate (Glu), (6) 5 mM Lac, (7) 0.1% sodium azide, (8) 50 mM potassium phosphate monobasic ($KH_2PO_4$), (9) 56 mM sodium hydroxide (NaOH) and (10) 1 ml/1 Gd-DPTA (Magnevist) (26,27).

In vivo studies were conducted on two healthy volunteers.

b. Experiment Parameters

The sequence parameters for the experiments on the GE MRS Braino phantom were as follows: voxel size=30×30×30 $mm^3$, NSA=8, TR=2000 ms, minimum TE=27 ms (JPRESS), 30 ms (J-resolved sLASER), and 39 ms (J-resolved LASER), 32 TE steps with an incremental size $\Delta TE$ (or $\Delta t_1$)=10 ms. 1024×32 points were acquired with spectral widths of 2000 Hz×100 Hz in the $F_2 \times F_1$ dimensions, total scan time=8 mins and 32 s.

The NAA phantom experiments were used to assess the efficiency of suppressing additional J-refocused peaks by the proposed J-resolved LASER and sLASER sequences, compared with that of JPRESS. In the JPRESS sequence, a lower BW of 180° refocusing pulse (about 843 Hz) instead of the default 180° refocusing pulse "gtst1203" (BW=1263 Hz) was employed to make J-refocused peaks clearly visible on the 2D JPRESS spectrum. The other parameters were the same as those used in the GE MRS Braino phantom experiments.

The GE MRS Braino phantom was also used to measure the slice profiles of the 180° refocusing pulses used in the three J-resolved spectroscopy sequences. During data collection, a read-out gradient of 0.04 mT/m was applied along the same direction of the slice-selective gradient for the tested refocusing pulses. The experimental parameters were as follows: repetition time (TR)=2000 ms, TE=50 ms, number of signal averages (NSA)=16, slice thickness=30 mm, 1024 points acquired, duration of echo sampling=512 ms, spectral width=2000 Hz, and the RF offset frequency was set to water resonance frequency. The profile width at half height was calculated using the following formula: Profile width=γ×Slice thickness×Amplitude of read-out gradient (4). For a 30-mm slice thickness, an ideal profile was a rectangular with a width of 51.12 Hz.

For in vivo experiments, a 30×30×30 mm³ voxel was placed aligned with the parieto-occipital junction of healthy volunteers. The durations of all spoiler gradients were 1.81 ms and the minimum TEs were 42 ms and 57 ms for the J-resolved sLASER and J-resolved LASER sequences, respectively. The other parameters were the same as those used on the GE MRS Braino phantom.

c. Spectral Data Processing and Analysis

The 2D MRS data were processed using Felix software (Accelrys Inc. San Diego, Calif., USA). The datasets were zero-filled from 1024 to 2048 points in the direct dimension ($F_2$) and from 32 to 128 points in $F_1$. A solvent suppression with sinebell window function of 32 Hz was applied. A skewed sinebell-squared window function with the skew parameter of 1, a size of 2048 points, and the phase of 90° was applied to $F_2$. A skewed sinebell-squared window function with the skew parameter of 1, a size of 128 points and the phase of 90° was applied to $F_1$. The combination of phase=90° and skew parameter=1 along both $F_1$ and $F_2$ has the advantage to present the 2D spectra with small linewidths and well resolved peaks especially along $F_2$ direction. A custom-made Matlab program was used for visualization and quantification of peak volumes.

d. Results

Figure 4A:
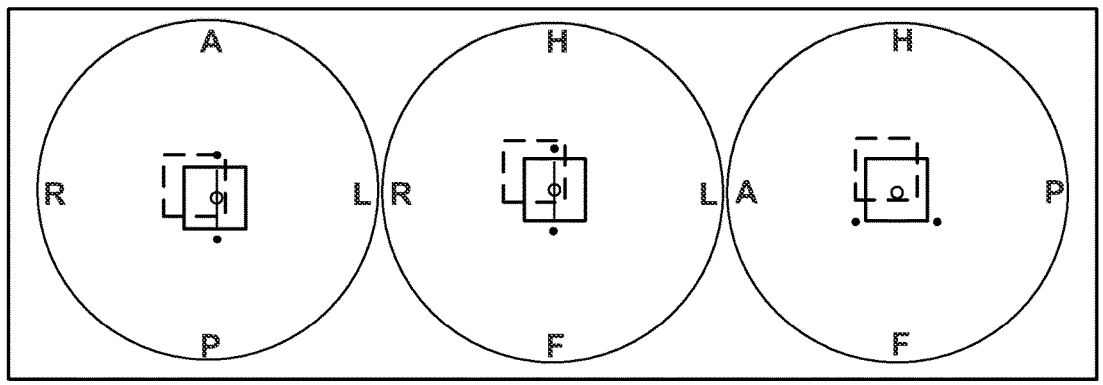
FIG. 4A illustrates an example chemical shift displacement between 2 ppm and 5.5 ppm in the anterior-posterior (AP), right-left (RL), and foot-head (FH) directions, generated by one example embodiment of a JPRESS pulse sequence.
Figure 4B:
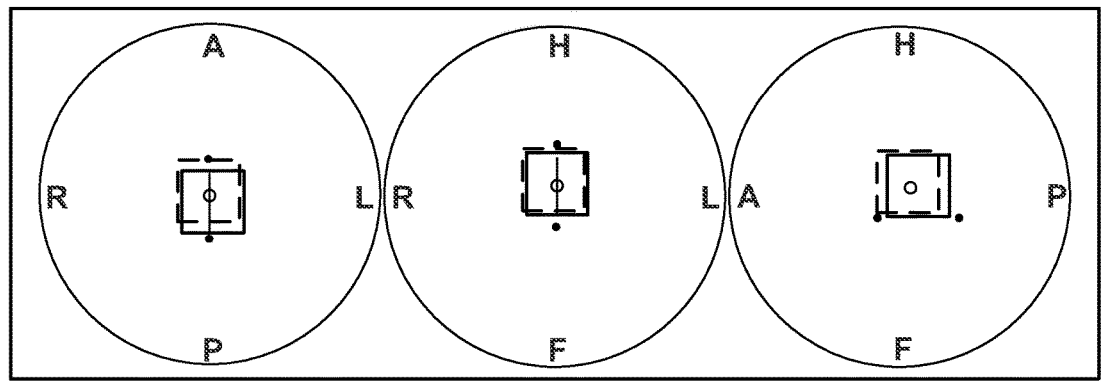
FIG. 4B illustrates an example chemical shift displacement between 2 ppm and 5.5 ppm in the anterior-posterior (AP), right-left (RL), and foot-head (FH) directions, generated by one example embodiment of an sLASER pulse sequence, in accordance with the embodiment of FIG. 1B.
Figure 4C:
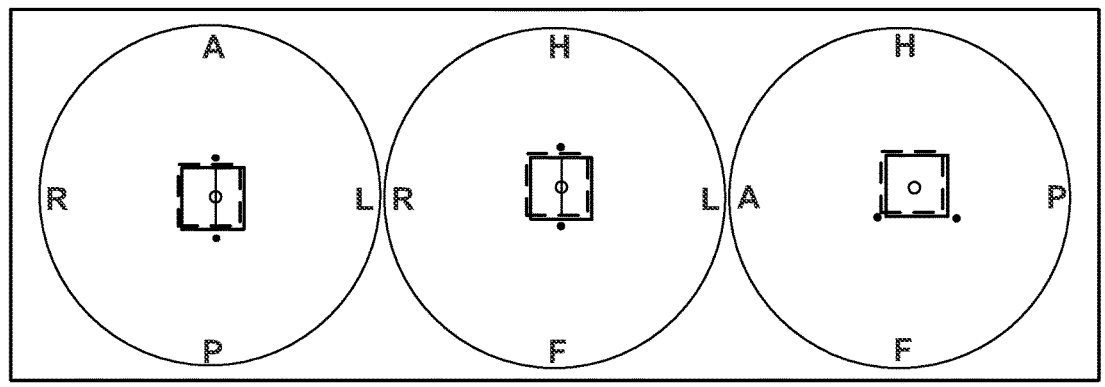
FIG. 4C illustrates an example chemical shift displacement between 2 ppm and 5.5 ppm in the anterior-posterior (AP), right-left (RL), and foot-head (FH) directions, generated by one embodiment of a LASER pulse sequence, in accordance with the embodiment of FIG. 1A.

FIGS. 4A-C show the chemical shift displacements in three directions: anterior-posterior (AP), right-left (RL) and foot-head (FH) between the two voxels volume-selected for a chemical shift of 2 ppm (solid box, for example a NAA peak) and 5.5 ppm (dashed box, for example a lipid peak), using the JPRESS, J-resolved sLASER, and J-resolved LASER sequences on the GE MRS Braino phantom. The CSDEs were significantly suppressed using J-resolved LASER and sLASER sequences compared with the JPRESS sequence. In JPRESS (FIG. 4A), the CSDE of the non-adiabatic slice-selective 90° pulse in AP direction was smaller than those of the non-adiabatic slice-selective 180° pulses in RL and FH directions. In the J-resolved sLASER experiment (FIG. 4B), the CSDE of the non-adiabatic slice-selective 90° pulse in AP is the same as that in JPRESS (FIG. 4A) because the same slice-selective 90° excitation pulses were used. However, the CSDEs in the other two directions: RL and FH were significantly suppressed by using two pairs of AFP pulses. Using J-resolved LASER (FIG. 4C), the CSDEs in all three directions were significantly suppressed by using three pairs of AFP pulses. Between the two adiabatic J-resolved spectroscopy sequences, the J-resolved sLASER sequence had the advantages of shorter TE (or possibly higher SNR) and lower SAR, but the CSDE in J-resolved sLASER was larger than that in J-resolved LASER.

The CSDE in the plane defined by an RF pulse can be expressed as:

$$CSDE = \frac{\Delta f}{BW} = \frac{\Delta \delta \cdot f_0}{BW} \quad [1]$$

where $\Delta f$ is the frequency difference of two resonances in hertz (Hz), $\Delta\delta$ is the chemical shift difference in ppm, BW is the bandwidth in Hz of the slice-selective RF pulse for the plane, and $f_0$ is the carrier frequency of the scanner in MHz. The chemical shift displacement artifact can be described as the percent voxel overlap between the resonances at two chemical shifts according to Eq. [1]:

$$\left(1 - \frac{\Delta\delta \cdot f_0}{BW_x}\right)\left(1 - \frac{\Delta\delta \cdot f_0}{BW_y}\right)\left(1 - \frac{\Delta\delta \cdot f_0}{BW_z}\right),$$

assuming the voxel is defined by the intersection of planes x, y and z (1). For example, two resonances with a chemical shift difference of 3.5 ppm, only have a percent voxel overlap of 32% using the JPRESS sequence with a routine slice-selective 90° excitation pulse (BW~2000 Hz) and two routine slice-selective 180° refocusing pulses (BW~1200 Hz) on a clinically available 3 T MRI scanner, such as a Phillips Achieva 3 T scanner. In contrast, the percent voxel overlap can be increased to 74% using the J-resolved LASER sequence and 64% using the J-resolved sLASER sequence.

Theoretical investigation of the effects of J-couplings on signal formation of conventional JPRESS, ignoring relaxation, diffusion, and other effects, was also conducted. Considering a homonuclear J-coupled AX spin-1/2 system with a coupling constant J, in a part of the plane excited by a slice-selective 180° pulse for spin X, spin A does not experience the pulse due to the chemical shift displacement between the spins A and X (9). The voxels can be decomposed into 2 distinct sub-voxels: in subvoxel 1, spin A experiences the second 180° pulse, and in subvoxel 2, spin A dose not experience the second 180° pulse (7,9). Assuming $M_X$ is the equilibrium magnetization per unit volume of spin X and $\Omega_m$ is the frequency offset of spin m (m=A or X) in the rotating frame, the signal arising from the sub-voxels 1 and 2 at t=$t_2$ can be expressed as $S_1$ and $S_2$, respectively, as follows:

$$S_1 = M_X V_1 e^{-i(\pm \pi J)(t1+t2)} e^{-i\Omega_X t2};$$

$$S_2 = M_X V_2 e^{-i(\Omega_X \pm \pi J)t2}, \quad [2]$$

where $V_1$ and $V_2$ are the volumes of subvoxels 1 and 2, respectively. As a result, the expected J-resolved peaks appear at $(F_1, F_2)=(-J/2, \Omega/2\pi+J/2)$ and $(J/2, \Omega/2\pi-J/2)$, and the additional J-refocused peaks at $(F_1, F_2)=(0, \Omega/2\pi\pm J/2)$. Therefore, there is no J-split for the J-refocused peaks along $F_1$ dimension. If spin X is also coupled with spins i=1, 2, 3 ... n, besides with spin A, the additional J-refocused peaks will appear at the middle of the intended J-resolved peaks caused by J-coupling of spins A and X along $F_1$ axis but with the same corresponding $F_2$ coordinate values:

$$S_1 = M_X V_1 e^{-\pi(\pm J \pm J_1 \pm J_2 \ldots \pm J_n)(t1+t2)} e^{-i\Omega_X t2};$$

$$S_2 = M_X V_2 e^{-\pi(\pm J_1 \pm J_2 \ldots \pm J_n)(t1+t2) - \pi(\pm J)t2} e^{-\Omega_X t2}, \quad [3]$$

where $J_i$ is the coupling constant between spins X and i, and the chemical shift displacement between spins X and i is ignored. Given $V=V_1+V_2$, $V_1$ and $V_2$ can be written as:

$$V_1 = \left(1 - \frac{\Delta\delta_{AX} \cdot f_0}{BW_{refocus}}\right)V; \quad [4]$$

$$V_2 = \frac{\Delta\delta_{AX} \cdot f_0}{BW_{refocus}}V,\quad 5$$

where $\Delta\delta_{AX}$ is the chemical shift difference in ppm of the spins A and X, $BW_{refocus}$ is the bandwidth in Hz of the slice-selective refocusing pulse. Therefore, the intensity of the intended J-resolved peaks will be weakened by a factor of $$1 - \frac{\Delta\delta_{AX} \cdot f_0}{BW_{refocus}}. \quad (7, 9)$$

It can be concluded that a limited BW not only leads to additional J-refocused peaks but also reduces the intensities of the intended J-resolved peaks.

Figure 5:
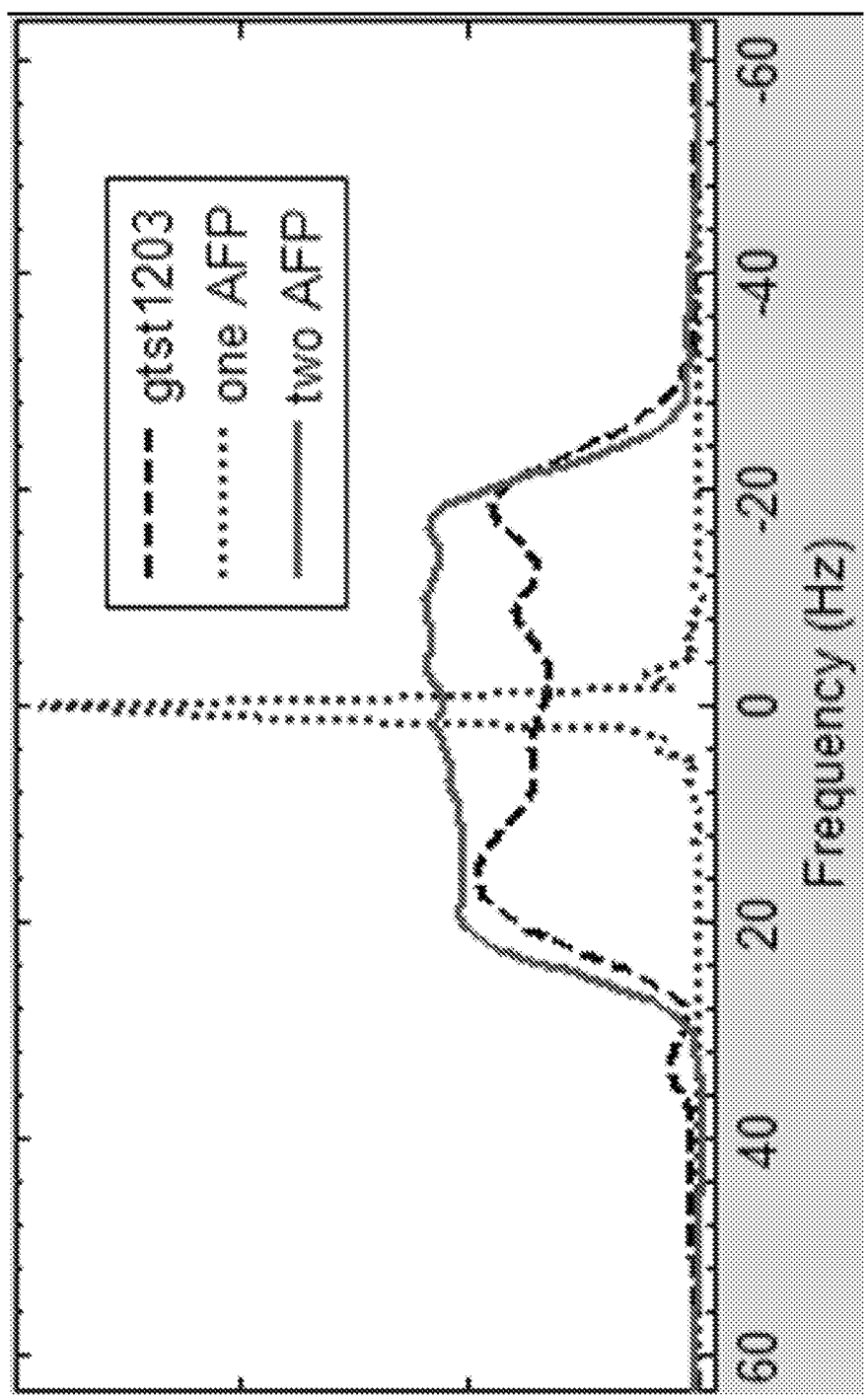
FIG. 5 illustrates slice profiles of an example gtst1203 refocusing pulse (dash line), a single AFP refocusing pulse (dot line) and a pair of AFP refocusing pulses (solid line).

The slice profiles of the refocusing pulse of 'gtst1203' used in JPRESS and the AFP pulses used in J-resolved sLASER and J-resolved LASER sequences are shown in FIG. 5. Because the signal only exists in a very narrow bandwidth, a single AFP pulse (dot line) alone cannot be used for slice selection. As shown in FIG. 5, a pair of AFP pulses (solid line) had higher intensity, a flatter top, steeper edges, and almost completely suppressed sidelobes compared with the refocusing pulse 'gtst1203' (dash line). Therefore, the pair of AFP pulses provided improved slice profile than "gtst1203". 1D experiments performed on the GE MRS Braino phantom showed that the signals of LASER and sLASER are larger than the signal of PRESS at their respective shortest TEs, although the TEs used in the LASER and sLASER sequences were 13 ms and 3 ms longer than the TE used in the PRESS sequence, respectively.

Figure 6A:
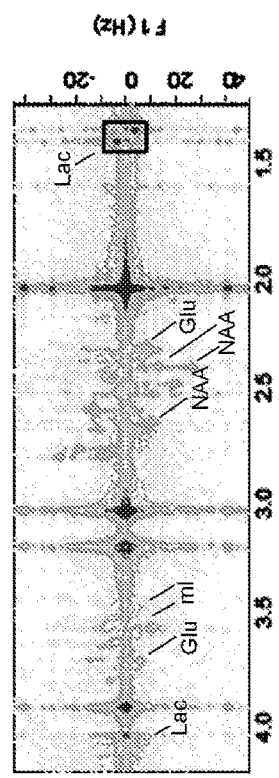
FIG. 6A illustrates a 2D spectra obtained from the GE MRS Braino phantom using an example JPRESS pulse sequence with TE starting at 27 ms.
Figure 6B:
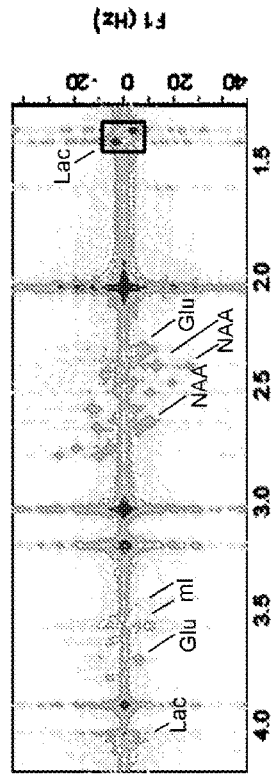
FIG. 6B illustrates a 2D spectra obtained from the GE MRS Braino phantom using an example J-resolved sLASER pulse sequence, in accordance with the embodiment of FIG. 1B, with TE starting at 30 ms.
Figure 6C:
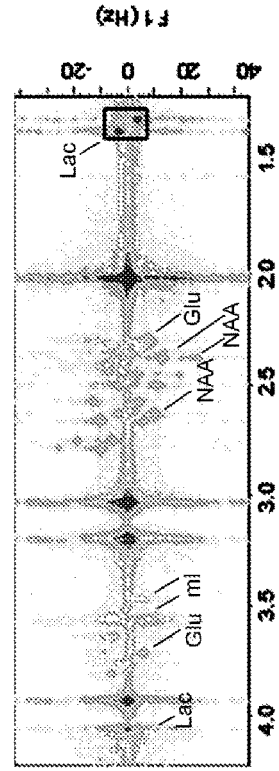
FIG. 6C illustrates a 2D spectra obtained from the GE MRS Braino phantom using an example J-resolved LASER pulse sequence, in accordance with the embodiment of FIG. 1A, with TE starting at 39 ms.
Figure 6D:
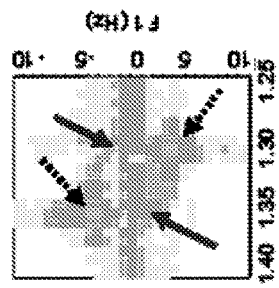
FIGS. 6D-6F are detail views of the boxes provided in FIGS. 6A-6C, respectively, shown to illustrate the doublet of lactate (Lac) at 1.33 ppm.
Figure 6E:
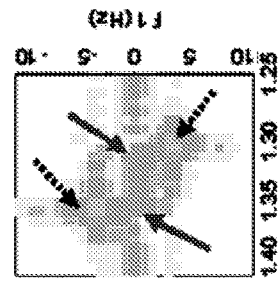
Figure 6F:
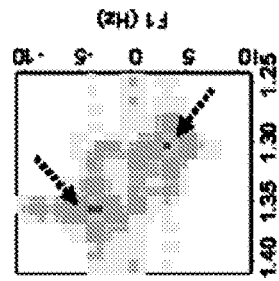

FIGS. 6A-F show the 2D spectra obtained from the GE MRS Braino phantom using JPRESS with TE starting at 27 ms (A), J-resolved sLASER with TE starting at 30 ms (B); and J-resolved LASER with TE starting at 39 ms (C). J-resolved LASER and sLASER sequences produced very similar 2D J-resolved spectra with the JPRESS spectrum. The 2D J-resolved LASER and sLASER spectra showed almost the same pattern as the JPRESS spectrum. The metabolites with coupled spin systems, i.e., Glu. NAA, ml, and Lac (marked in the Figures), yielded expected J-resolved peaks arranged at a 45° angle to $F_1=0$ axis in the 2D spectra. Because J-multiplet resonances spread into the second dimension, these J-resolved peaks were easier to be resolved in 2D J-resolved spectra than in 1D spectra. Besides the similarity, differences between the J-resolved LASER and sLASER and conventional JPRESS spectra demonstrated the strengths of J-resolved LASER and sLASER over conventional JPRESS. FIGS. 6D-F represent the zoomed views of the Lac doublet at 1.32 ppm in the white boxes of the left column (FIGS. 6A-C). The additional J-refocused artifactual peaks (marked by the solid arrows) were prominent in JPRESS (FIG. 6D), considerably reduced in J-resolved sLASER (FIG. 6E), and further reduced to a minimal level in J-resolved LASER (FIG. 6F). The additional J-refocused peaks were strongest in JPRESS and weakest in J-resolved LASER. In contrast, the intended J-resolved peaks, as marked by the dotted arrows, were the strongest in J-resolved LASER and the weakest in JPRESS. This was verified by the quantified peak volumes in Table 1. Most of the J-multiplets such as NAA, ml, Lac, and Glu can be clearly separated in the 2D spectra.

TABLE 1

Peak volumes of additional J-refocused artifactual peaks vs. intended J-resolved peaks of Lac at $F_2$ = 1.32 ppm in FIG. 6.

| Experiments | J-refocused peak volume (i.u.) | | J-resolved peak volume (i.u) | |
|---|---|---|---|---|
| | Left | Right | Left | Right |
| JPRESS | 462 | 432 | 728 | 706 |
| J-resolved sLASER | 313 | 253 | 877 | 781 |
| J-resolved LASER | 166 | 136 | 892 | 835 |

In Table 1, the J-refocused peaks were smaller in J-resolved LASER than J-resolved sLASER because the $t_2$ noise along the $F_2$ axis was weaker in J-resolved LASER than that in the J-resolved sLASER. The $t_2$ noise level increased with the signal amplitudes in the spectrum (38). In the case of the GE MRS Braino phantom experiments, the level of the noise along $F_2$ axis was mainly controlled by the amplitude of dominant residual water signal. The residual water signal was strongest in the JPRESS spectrum and weakest in the J-resolved LASER spectrum, which therefore brought about the strongest $t_2$ noise in the JPRESS spectrum and the weakest $t_2$ noise in the J-resolved LASER spectrum (see FIG. 6D-F). This is also the reason that the total Lac peak volume (sum of the J-refocused peak volumes and J-resolved peak volumes) was larger in the JPRESS spectrum than those in the J-resolved sLASER and J-resolved LASER spectra as shown in Table 1.

Figure 7C:
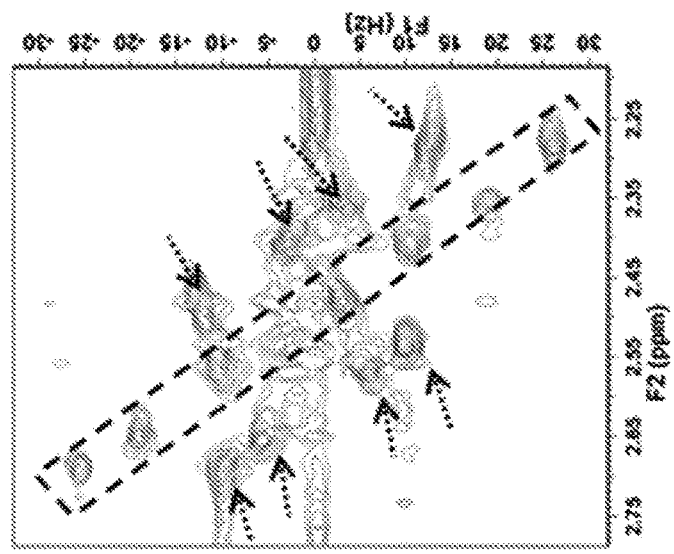
FIGS. 7A-7C illustrate the 2D spectra of N-Acetylaspartic acid (NAA) at 2.20-2.75 ppm obtained with an example JPRESS sequence using low-BW pulses, an example J-resolved sLASER pulse sequence in accordance with the embodiment of FIG. 1B, and an example J-resolved LASER pulse sequence in accordance with the embodiment of FIG. 1A, respectively.
Figure 7B:
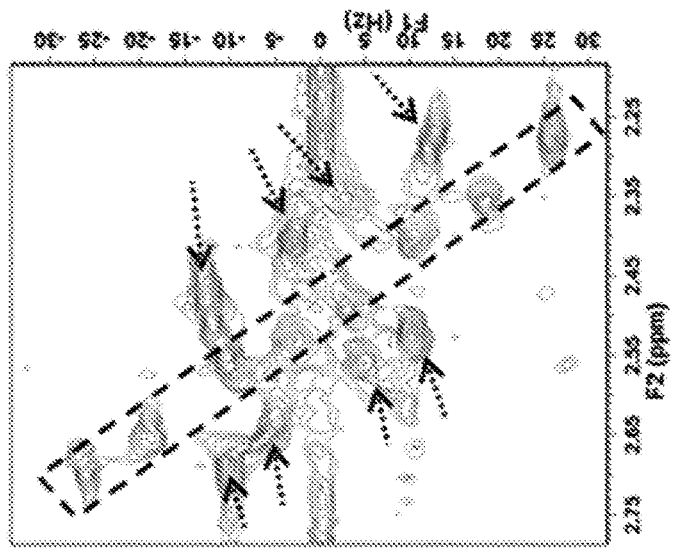
Figure 7A:
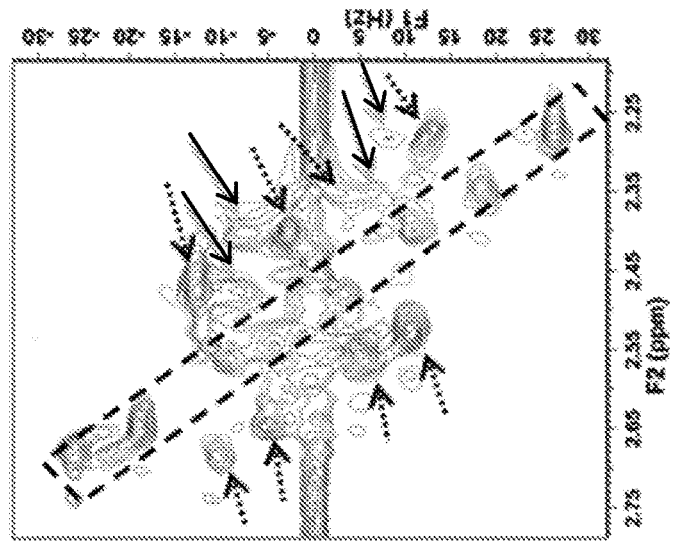

Similar with the Lac spectra in FIGS. 6A-F, the spectra of NAA phantom in FIGS. 7A-C also shows additional J-refocused artifactual peaks (marked by the solid arrows) within the double-of-doublets at 2.4 ppm in JPRESS. The 2D spectra of NAA at 2.20-2.75 ppm is shown for JPRESS using low-BW pulses (FIG. 7A), J-resolved sLASER (FIG. 7B), and J-resolved LASER (FIG. 7C). In contrast, these artifactual peaks were barely seen in J-resolved LASER and sLASER spectra. As a result, the intended J-resolved peaks of the double-of-doublets at 2.4 ppm (marked by the dashed arrows) were attenuated the most in JPRESS and the least in the J-resolved LASER. The finding on the J-resolved peaks was verified by the data shown in Table 2, which presents the quantified volumes of intended J-resolved peaks of the two double-of-doublets at 2.4 ppm and 2.6 ppm. In addition, eight additional peaks (marked by the white dashed boxes) appeared in the middle of the two double-of-doublets at 2.4 and 2.6 ppm in all three J-resolved spectra. The additional peaks resulted from strong J-coupling between the two spins at 2.4 and 2.6 ppm (28-30). The strong-coupling artifacts of NAA can also be seen clearly in the three J-resolved spectra of FIG. 6.

TABLE 2

Peak volumes of two double-of-doublets (intended J-resolved peaks) of NAA at $F_2$ = 2.6 ppm and 2.4 ppm in FIG. 7 (normalized to NAA singlet peak volume at 2.0 ppm).

| | Peak volumes of double-of-doublets (from left to right in FIG. 7) | | | | | | | |
|---|---|---|---|---|---|---|---|---|
| Experiments | $F_2$ = 2.6 ppm | | | | $F_2$ = 2.4 ppm | | | |
| JPRESS | 0.039 | 0.041 | 0.089 | 0.088 | 0.061 | 0.079 | 0.042 | 0.035 |
| J-resolved | 0.055 | 0.070 | 0.091 | 0.082 | 0.084 | 0.080 | 0.082 | 0.048 |

TABLE 2-continued

Peak volumes of two double-of-doublets (intended J-resolved peaks) of NAA at $F_2$ = 2.6 ppm and 2.4 ppm in FIG. 7 (normalized to NAA singlet peak volume at 2.0 ppm).

| | Peak volumes of double-of-doublets (from left to right in FIG. 7) | | | | | | | |
|---|---|---|---|---|---|---|---|---|
| Experiments | $F_2$ = 2.6 ppm | | | | $F_2$ = 2.4 ppm | | | |
| sLASER J-resolved LASER | 0.059 | 0.069 | 0.103 | 0.093 | 0.053 | 0.090 | 0.093 | 0.048 |

FIGS. 8A-I demonstrate how the signals were attenuated with the change of center frequency of RF pulses. FIGS. 8A-D illustrate the JPRESS spectra and FIGS. 8E-H the J-resolved LASER spectra. The RF frequency offset was set to 2 ppm in FIGS. 8A and 8E, 4 ppm in FIGS. 8B and 8F, 6 ppm in FIGS. 8C and 8G, and 8 ppm in FIGS. 8D and 8H. The resonance intensities in PRESS were significantly attenuated as the RF frequency offset was moved away from the frequencies of those resonance lines. However, the resonance intensities in J-resolved LASER were not attenuated when the RF frequency shifted within the pulse BW.

Figure 9A:
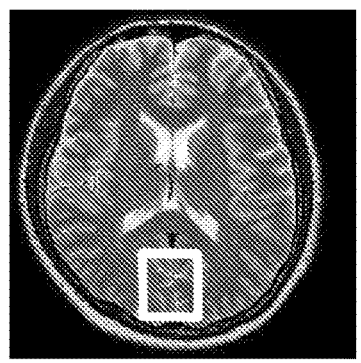
FIGS. 9A and 9B are images of a human brain obtained using MRI, showing the parieto-occipital junction labeled in the white boxes.
Figure 9B:
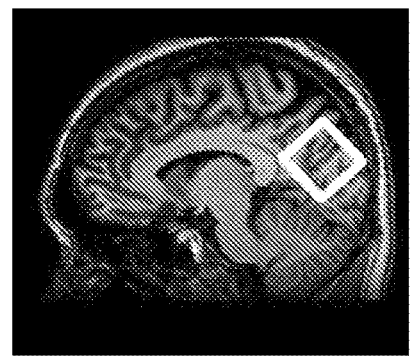
Figure 9C:
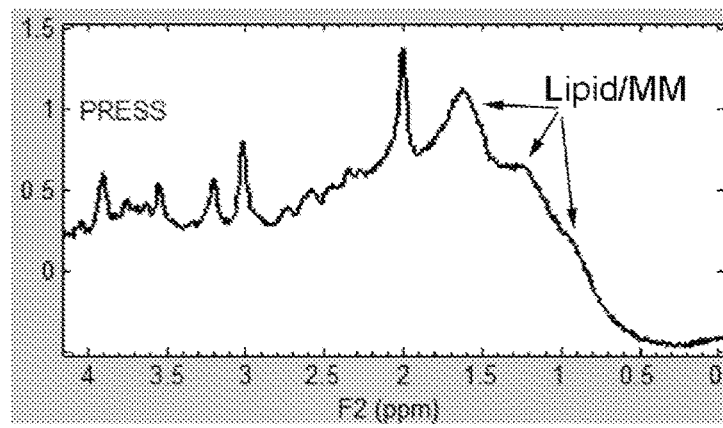
FIGS. 9C-9E illustrate 1D spectra acquired from a voxel encompassing the parieto-occipital junction of a healthy volunteer using a JPRESS pulse sequence, a J-resolved sLASER pulse sequence in accordance with the embodiment of FIG. 1B, and a J-resolved LASER pulse sequence in accordance with the embodiment of FIG. 1A, respectively, all at their respective minimum TEs.
Figure 9D:
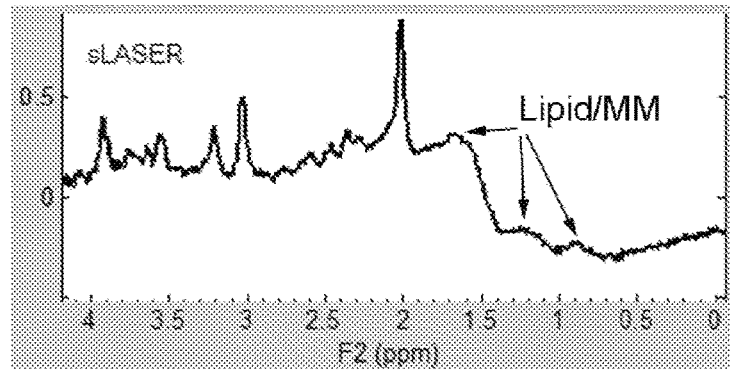
Figure 9E:
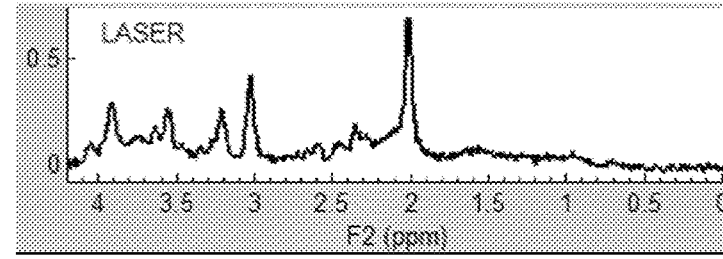

FIGS. 9C-E show 1D spectra acquired from a voxel encompassing the parieto-occipital junction of a healthy volunteer (shown in FIGS. 9A and 9B) using JPRESS (C), J-resolved sLASER (D) and J-resolved LASER (E) at their respective minimum TEs. Compared with JPRESS (FIG. 9C), the lipid/macromolecular (MM) peaks at 0.9-1.6 ppm was reduced in J-resolved sLASER (FIG. 9D) and further reduced in J-resolved LASER (FIG. 9E). The lipid/MM peaks at 0.9, 1.3 and 1.6 ppm were strongest in PRESS and smallest in LASER.

Figure 10A:
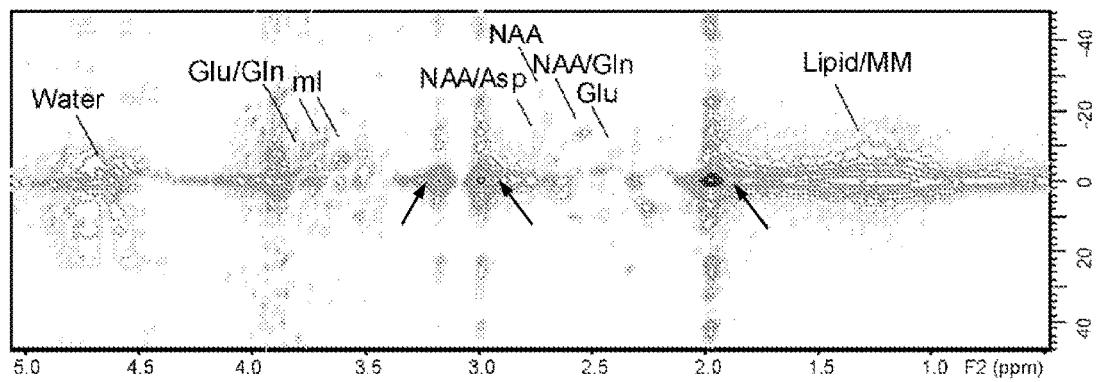
FIGS. 10A-10C illustrate 2D spectra acquired from a voxel encompassing the parieto-occipital junction of another healthy volunteer using a JPRESS pulse sequence, an example J-resolved sLASER pulse sequence in accordance with the embodiment of FIG. 1B, and an example J-resolved LASER pulse sequence in accordance with the embodiment of FIG. 1A, respectively.
Figure 10B:
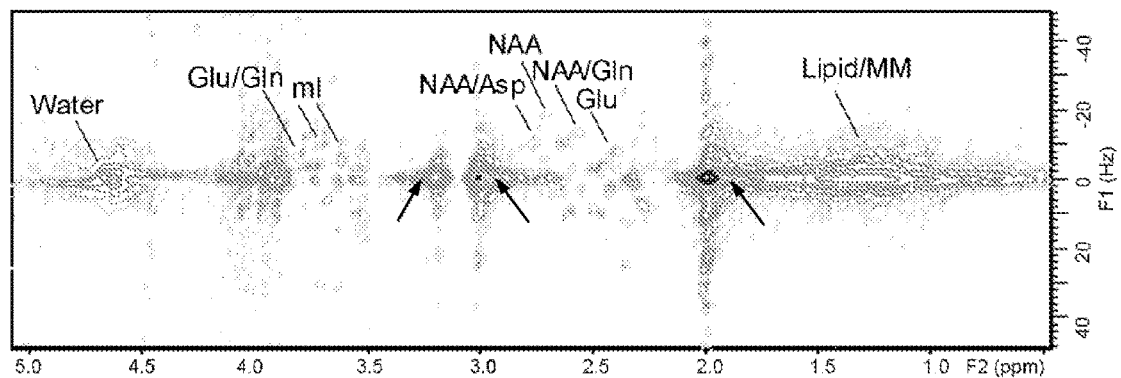
Figure 10C:
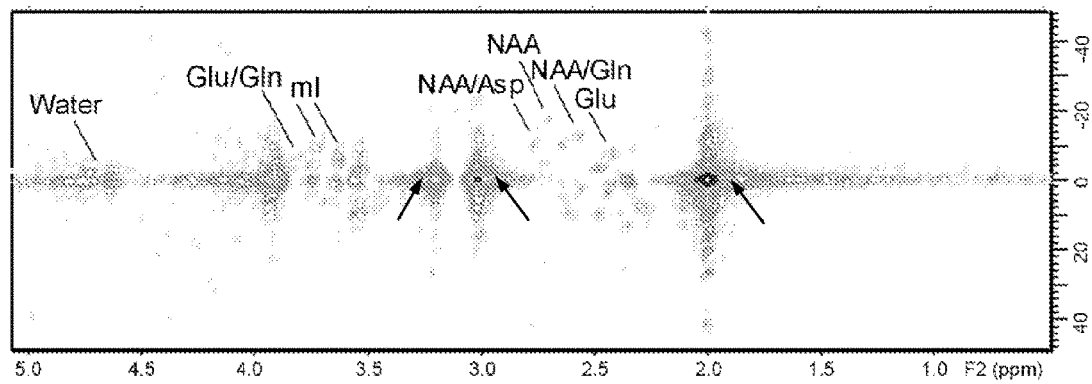

FIG. 10 shows the in vivo 2D J-resolved spectra acquired from the parieto-occipital junction of another healthy volunteer using JPRESS (A), J-resolved sLASER (B) and J-resolved LASER (C). Compared with the 2D spectra of the GE MRS Braino phantom in FIGS. 6A-F, the in vivo 2D J-resolved spectra of the human brain had larger linewidths as well as more apparent "phase-twist" lineshape (7) especially in the singlet resonances of NAA, Cr, and Cho (marked by the arrows). Except for the above differences, the spectra acquired from the human brain and the GE MRS phantom exhibited very similar 2D J-resolved spectra, which further verified the feasibility of the proposed J-resolved LASER and sLASER sequences for in vivo application. At least two differences were present among the three J-resolved spectra of the human brain. One difference is demonstrated on the lipid/MM peaks. Similar with FIGS. 9C-E, the lipid/MM peaks were clearly seen in both JPRESS and J-resolved sLASER spectra, but barely shown in the J-resolved LASER spectrum. Furthermore, the lipid/MM peaks in the J-resolved sLASER spectrum (FIG. 10B) were not reduced distinctly compared with the JPRESS spectrum (FIG. 10A), because the slice close to the scalp was defined by a regular slice-selective 90° pulse in both sequences. In contrast, the extracranial lipid due to CSDE was significantly suppressed in J-resolved LASER using three pairs of AFP pulses for voxel localization. Another difference was found with regard to the residual water peak, which was most prominent in JPRESS, reduced in J-resolved sLASER and smallest in J-resolved LASER. This observation was consistent with a recent report of adiabatic localized COSY spectra (4). Decreased residual water and out-of-volume lipid/MM signals will benefit spectral quantification, especially for those metabolites with resonances close to the strong "phase-twisted" water or lipid peaks.

Compared to the 2D J-resolved spectra of the GE MRS Braino phantom in FIGS. 6A-F, the metabolites in the human brain yielded very similar resonances in FIG. 10 (see marked metabolites) and even those additional peaks of NAA due to strong J-coupling in phantom spectra (FIGS. 6 and 7) were also clearly shown in the in vivo spectra. However, the GE MRS Braino phantom only contained NAA, Cr, Cho, Glu, mI and Lac, while there are known to be about 20 MRS-detectable metabolites in the human brain. Some metabolite resonances still overlapped with one another in the in vivo spectra, such as Glu resonances with glutamine (Gln) resonances at 3.75 ppm, NAA with Gln at 2.45 ppm and aspartate (Asp) at 2.65 ppm. Quantification of 2D MRS spectra by peak volumes is known to require precise selection of peak areas free from any overlap (30, 32). Quantification can be further improved by 2D fitting, such as ProFit (33). However, correlation matrix analysis revealed that two metabolites could not be reliably retrieved by quantitation algorithms if all the resonances of one metabolite reside at the same locations in spectral space as those of the other metabolite (34-36). For at least the above reasons, J-resolved LASER and J-resolved sLASER may possess advantages over conventional JPRESS because suppression of CSDE and additional Jrefocused artifactual peaks, as well as reduction of residual water peak and lipid/MM signals can reduce the chance of overlap and thus improve the spectral quantification of 2D MRS data.

The 2D spectra acquired in the phantom experiments showed additional J-refocused peaks in JPRESS spectrum while these additional artifactual peaks were significantly suppressed in J-resolved LASER and sLASER spectra. (See FIGS. 6 and 7). The additional J-refocused artifactual peaks doubled the number of peaks of weakly-coupled spin systems in the 2D J-resolved spectrum and made the spectrum more crowded and thus more difficult to resolve and quantify the metabolite signals. Furthermore, the intensities of the intended J-resolved peaks were attenuated by the factor of $(1 - \Delta f/BW)$ (7-9). Quantification of JPRESS spectra can be further impaired without correct consideration of this factor. The imperfect flip angle of last 180° RF pulse also led to additional artifactual peaks which are known as "phantom" and "ghost" responses in heteronuclear J-spectra reported by Bodenhausen et al. (37). However, the "phantom" and "ghost" multiplets can be eliminated by phase cycling or gradients, but the J-refocused peaks observed in the disclosure herein had the same coherence transfer pathway as the J-resolved peaks and could not be removed by phase cycling or gradients (7,37).

In sum, compared with JPRESS, J-resolved LASER and J-resolved sLASER significantly suppressed additional J-refocused artifactual peaks and reduced CSDE. While SNR may potentially be lower in J-resolved sLASER and J-resolved LASER than JPRESS, the J-resolved MRS methods disclosed herein provide advantages over PRESS, including insensitivity to $B_1$ inhomogeneity, the ability to provide uniform flip angle over large BWs, and suppression of chemical shift artifacts and additional J-refocused artifactual peaks. Further, because suppression of CSDE and additional J-refocused artifactual peaks as well as reduction of residual water peak and lipid/MM signals can significantly reduce the chance of overlap, the spectral quantification of 2D MRS data can be improved. These advantages make J-resolved LASER and J-resolved sLASER spectroscopy promising in the in vivo application for more reliable and accurate quantification of metabolites. For at least the reasons described above, J-resolved LASER and J-resolved sLASER possess advantages over conventional JPRESS.

An exemplary embodiment of the present invention has been described above. Those skilled in the art will understand, however, that changes and modifications may be made to this embodiment without departing from the true scope and spirit of the invention, which is defined by the claims.

REFERENCES (1) Boer V O, van Lier A L H M, Hoogduin J M, Wijnen J P, Luijten P R, Klomp D W J. 7-T 1H MRS with adiabatic refocusing at short TE using radiofrequency focusing with a dual-channel volume transmit coil. NMR Biomed 2011; 24:1038-1046.
(2) Kinchesh P, Ordidge R J. Spin-echo MRS in humans at high field: LASER localisation using FOCI pulses. J Magn Reson B 2005; 175:30-43.
(3) Andronesi O C, Ramadan S, Ratai E M, Jennings D, Mountford C E, Sorensen A G. Spectroscopic imaging with improved gradient modulated constant adiabaticity pulses on high-field clinical scanners. J Magn Reson 2010; 203:283-293.
(4) Ramadan S, Mountford C E. Adiabatic localized correlation spectroscopy (AL-COSY): application in muscle and brain. J Magn Reson Imaging 2011; 33:1447-1455.
(5) de Graaf R A. In vivo NMR spectroscopy—Principles and techniques. Chichester, UK: John Wiley; 1998.
(6) Bottomley P A. Spatial localization in NMR spectroscopy in vivo. Ann NY Acad Sci 1987; 508:333-348.
(7) Edden R A E, Barker P B. If J doesn't evolve, it won't J-resolve: J-PRESS with bandwidth-limited refocusing pulses. Magn Reson Med 2011; 65:1509-1514.
(8) Thompson R B, Allen P S. Sources of variability in the response of coupled spins to the PRESS sequence and their potential impact on metabolite quantification. Magn Reson Med 1999; 41:1162-1169.
(9) Yablonskiy D A, Neil J J, Raichle M E, Ackerman J J H. Homonuclear J coupling effects in volume localized NMR spectroscopy: Pitfalls and solutions. Magn Reson Med 1998; 39:169-178.
(10) Pauly J, Nishimura D, Macovski A. A linear class of large-tip-angle selective excitation pulses. J Magn Reson 1989; 82:571-587.
(11) Scheenen T W J, Ileerschap A, Klomp D W J. Towards 1H-MRSI of the human brain at 7 T with slice-selective adiabatic refocusing pulses. Magn Reson Mat Phys Biol Med 2008; 21:95-101.
(12) de Graaf R A, Luo Y. Terpstra M, Merkle H, Garwood M. A new localization method using an adiabatic pulse, BIR-4. J Magn Reson B 1995; 106:245-252.
(13) Tannus A, Garwood M. Adiabatic pulses. NMR Biomed 1997; 10:423-434.
(14) Norris D G. Adiabatic radiofrequency pulse forms in biomedical nuclear magnetic resonance. Concepts Magn Reson 2002; 14:89-101.
(15) Sacolick L I, Rothman D L, de Graaf R A. Adiabatic refocusing pulses for volume selection in magnetic resonance spectroscopic imaging. Magn Reson Med 2007; 57:548-553.
(16) de Graaf R A, Luo Y. Garwood M, Nicolay K. B-1-insensitive, single-shot localization and water suppression. J Magn Reson B 1996; 113:35-45.
(17) de Graaf R A, Luo Y, Terpstra M, Garwood M. Spectral editing with adiabatic pulses. J Magn Reson B 1995; 109:184-193.
(18) Garwood M, DelaBarre L. The return of the frequency sweep: Designing adiabatic pulses for contemporary NMR. J Magn Reson 2001; 153:155-177.
(19) Balchandani P, Pauly J, Spielman D. Slice-selective tunable-flip adiabatic low peak-power excitation pulse. Magn Reson Med 2008; 59:1072-1078.
(20) Moore J, Jankiewicz M, Anderson A W, Gore J C. Evaluation of non-selective refocusing pulses for 7 T MRI. J Magn Reson 2012; 214:212-220.
(21) de Graaf R A, Nicolay K. Adiabatic water suppression using frequency selective excitation. Magn Reson Med 1998; 40:690-696.
(22) Andreychenko A, Boer V O, Luijten P. R., Klomp D W. Efficient spectral editing at 7 T: GABA detection with MEGA-sLASER. Magn Reson Med 2012; doi: 10.1002/mrm.24131.
(23) Andronesi O C, Ramadan S, Mountford C E, Sorensen A G. Low-power adiabatic sequences for in vivo localized two-dimensional chemical shift correlated MR spectroscopy. Magn Reson Med 2010; 64:1542-1556.
(24) Andronesi O C, Kim G S, Gerstner E, Batchelor T, Tzika A A, Fantin V R, Vander Heiden M G, Sorensen A G. Detection of 2-hydroxyglutarate in IDH-mutated glioma patients by in vivo spectral-editing and 2D correlation magnetic resonance spectroscopy. Sci Transl Med 2012; 4:116ra4.
(25) Scheenen T W J, Klomp D W J. Wijnen J P, Heerschap A. Short echo time 1H-MRSI of the human brain at 3 T with minimal chemical shift displacement errors using adiabatic refocusing pulses. Magn Reson Med 2008; 59:1-6.
(26) Schirmer T. Auer D P. On the reliability of quantitative clinical magnetic resonance spectroscopy of the human brain. NMR Biomed 2000; 13:28-36.
(27) Thomas M A, Yue K, Binesh N, Davanzo P, Kumar A, Siegel B, Frye M, Curran J, Lufkin R, Martin P, Guze B. Localized two-dimensional shift correlated MR spectroscopy of human brain. Magn Reson Med 2001; 46:58-67.
(28) Lange T, Trabesinger A H, Schulte R F, Dydak U, Boesiger P. Prostate spectroscopy at 3 tesla using two-dimensional S-PRESS. Magn Reson Med 2006; 56:1220-1228.
(29) Lin M J, Lin Y Q, Chen X, Cai S H, Chen Z. High-resolution absorptive intermolecular multiple-quantum coherence NMR spectroscopy under inhomogeneous fields. J Magn Reson 2012; 214:289-295.
(30) Ryner L N, Sorenson J A, Thomas M A. Localized 2D J-resolved 1H Mr spectroscopy: strong-coupling effects in-vitro and in-vivo. J Magn Reson Imaging 1995; 13:853-869.
(32) Thomas M A, Hattori N, Umeda M, Sawada T, Naruse S. Evaluation of two-dimensional L-COSY and PRESS using a 3 T MRI scanner: from phantoms to human brain in vivo. NMR Biomed 2003; 16:245-251.
(33) Schulte R F, Boesiger P. ProFit: two-dimensional prior-knowledge fitting of J-resolved spectra. 2006; 19:255-263.
(34) Ratiney H, Sdika M, Coenradie Y, Cavassila S, van Ormondt D, Graveron-Demilly D. Time-domain semi-parametric estimation based on a metabolite basis set. NMR Biomed 2005; 18:1-13.
(35) Hu J N, Yang S L, Xuan Y, Jiang Q, Yang Y H, Haacke E M. Simultaneous detection of resolved glutamate, glutamine, and gamma-aminobutyric acid at 4 T. J Magn Reson 2007; 185:204-213.
(36) Yang S L, Hu J N, Kou Z F, Yang Y H. Spectral simplification for resolved glutamate and glutamine measurement using a standard STEAM sequence with optimized timing parameters at 3, 4, 4.7, 7, and 9.4 T. Magn Reson Med 2008; 59:236-244.
(37) Bodenhausen G, Freeman R, Turner D L. Suppression of artifacts in two-dimensional J spectroscopy. J Magn Reson 1977; 27:511-514.
(38) Mehlkopf A F, Korbee D, Tiggelman T A, Freeman R. Sources of t1 noise in two-dimensional NMR. J Magn Reson 1984; 58:315-323.
(39) Schulte R F, Lange T, Beck J, Meier D, Boesiger P. Improved two-dimensional J-resolved spectroscopy. NMR Biomed 2006; 19:264-270.

What is claimed:

1. A scanning system including a scanning apparatus configured to generate images from living tissue comprising:
a non-transitory computer-readable medium having stored therein instructions executable to cause a device configured to rectify images of the scanning apparatus to generate a readable output for the scanning apparatus as follows:
generating, by the scanning apparatus, a slice-selective radio frequency (RF) excitation pulse to excite a sample comprising living tissue;
generating a first pair of adiabatic full-passage (AFP) pulses to modify the signal from the sample after a delay time from the slice-selective RF excitation pulse;
generating at least a second pair of AFP pulses to modify the signal from the sample after a delay time from transmission of the first pair of AFP pulses;
receiving an echo signal by the scanning apparatus from transmission of a last AFP pulse;
obtaining a sequence of echo signals; and
generating two-dimensional magnetic resonance spectra having reduced chemical shift displacement error (CSDE) from the sequence of echo signals.

2. The scanning system of claim 1, wherein the scanning apparatus is a magnetic resonance imaging (MRI) apparatus.

3. The scanning system of claim 1, wherein the device is a magnetic resonance imaging (MRI) apparatus.

4. The scanning system of claim 1, wherein the slice-selective RF excitation pulse is a non-adiabatic slice-selective 90° RF pulse.

5. The scanning system of claim 1, the functions further comprising:
separating the second pair of AFP pulses to encode the spectroscopic signals in the second dimension.

6. The scanning system of claim 5, the functions further comprising:
separating the third pair of AFP pulses to encode the spectroscopic signal in the second dimension.

7. The scanning system of claim 1, wherein transmission of the first and the second pairs of AFP pulses causes suppression of one or more of chemical shift artifacts, J-refocused artefactual peaks, and sensitivity to inhomogeneity of RF field.

8. The scanning system of claim 1, the functions further comprising:
generating a third pair of AFP pulses to transmit to the sample after a delay time from transmission of the second pair of AFP pulses.

9. The scanning system of claim 1, the functions further comprising:
applying a magnetic field of a magnitude of 3T or higher.

10. The method of claim 9, wherein the method is used for generating 2D magnetic resonance spectroscopy.

11. The scanning system of claim 1, wherein the functions are applied to measure one or more of the following metabolites in the sample: N-acetylaspartate (NAA), creatine, choline-containing compounds, myo-inositol, glutamate, glutamine, γ-aminobutyric acid (GABA), glutathione, and lactate.

12. The method of claim 11, further comprising:
measuring one or more of the following metabolites in the sample: N-acetylaspartate (NAA), creatine, choline-containing compounds, myo-inositol, glutamate, glutamine, γ-aminobutyric acid (GABA), glutathione, and lactate.

13. A method for generating two-dimensional (2D) magnetic resonance spectroscopy (MRS) to improve quantification of metabolites in a sample comprising:
generating a slice-selective radio frequency (RF) excitation pulse for transmission to a sample;
generating a first pair of adiabatic full-passage (AFP) pulses to transmit to the sample after a delay time from transmission of the slice-selective RF excitation pulse;
generating at least a second pair of AFP pulses to transmit to the sample after a delay time from transmission of the first pair of AFP pulses;
receiving an echo signal from application of a last AFP pulse;
obtaining a sequence of echo signals; and
generating 2D magnetic resonance spectra having reduced chemical shift displacement error (CSDE) from the sequence of echo signals.

14. The method of claim 13, wherein the slice-selective RF excitation pulse is a non adiabatic slice-selective 90° RF pulse.

15. The method of claim 13 further comprising:
applying a magnetic field of a magnitude of 3T or higher to the sample.

16. The method of claim 13, wherein the delay time is $\Delta_1$, the first pair of AFP pulses is separated by an inter-pulse time interval $\Delta_2$, and the second pair of AFP pulses is separated by a time of $\Delta_2/2 + \Delta_1 + t_1/2$.

17. The method of claim 13 further comprising:
transmitting, to the sample, magnetic field spoiler gradients ($G_x$) along a first direction, magnetic field spoiler gradients ($G_y$) along a second direction, and magnetic field spoiler gradients ($G_z$) along a third direction.

18. The method of claim 13, further comprising:
maintaining stability of resonance signal intensities despite a transition of RF frequency away from frequencies of resonance lines.

19. The method of claim 13, further comprising:
separating the second pair of AFP pulses to encode the spectroscopic signal in the second dimension.

20. The method of claim 13, wherein transmission of the first and the second pairs of AFP pulses causes suppression of one or more of chemical shift displacement errors, J-refocused artefactual peaks, and sensitivity to inhomogeneity of RF field.

21. The method of claim 20, further comprising:
separating the third pair of AFP pulses to encode the spectroscopic signal in the second dimension.

22. The method of claim 13, further comprising:
generating a third pair of AFP pulses to transmit to the sample after a delay time from transmission of the second pair of AFP pulses.

23. The method of claim 13, wherein a sequence is provided to suppress J-refocused artefactual peaks while maintaining intended J-resolved peaks.

* * * * *

UNITED STATES PATENT AND TRADEMARK OFFICE
CERTIFICATE OF CORRECTION

PATENT NO. : 10,180,477 B2
APPLICATION NO. : 14/765244
DATED : January 15, 2019
INVENTOR(S) : Shaolin Yang It is certified that error appears in the above-identified patent and that said Letters Patent is hereby corrected as shown below:

In the Specification

Please add a paragraph at Column 1, Lines 14-19 under a heading STATEMENT OF GOVERNMENT RIGHTS as follows:
STATEMENT OF GOVERNMENT RIGHTS
This invention was made with government support under Grant Nos. R01 MH063764 and R01 MH073989, awarded by the National Institutes of Health (NIH). The government has certain rights in the invention.

Signed and Sealed this
Sixteenth Day of April, 2019

Andrei Iancu
*Director of the United States Patent and Trademark Office*